United States Patent
Sun et al.

(10) Patent No.: US 11,032,020 B2
(45) Date of Patent: Jun. 8, 2021

(54) SYNCHRONIZATION FOR SUBCARRIER COMMUNICATION

(71) Applicant: Infinera Corporation, Sunnyvale, CA (US)

(72) Inventors: Han H. Sun, Ottawa (CA); Kuang-Tsan Wu, Sunnyvale, CA (US); John D. McNicol, Ottawa (CA)

(73) Assignee: Infiriera Corporation, San Jose, CA (US)

( * ) Notice: Subject to any disclaimer, the term of this patent is extended or adjusted under 35 U.S.C. 154(b) by 0 days.

(21) Appl. No.: 16/577,960

(22) Filed: Sep. 20, 2019

(65) Prior Publication Data

US 2020/0351006 A1 Nov. 5, 2020

Related U.S. Application Data

(60) Provisional application No. 62/836,354, filed on Apr. 19, 2019.

(51) Int. Cl.
*H04B 10/40* (2013.01)
*H04B 10/61* (2013.01)
(Continued)

(52) U.S. Cl.
CPC .......... *H04J 14/0298* (2013.01); *H04B 10/40* (2013.01); *H04B 10/61* (2013.01); *H04L 7/0075* (2013.01)

(58) Field of Classification Search
CPC ................. H04J 14/0283; H04B 10/40; H04B 10/61–6166
See application file for complete search history.

(56) References Cited

U.S. PATENT DOCUMENTS 4,483,000 A    11/1984   Yamamoto et al.
4,528,565 A    7/1985   Hauptmann
(Continued)

FOREIGN PATENT DOCUMENTS

EP    0512642    11/1992
EP    3208957    8/2017
(Continued)

OTHER PUBLICATIONS

J. Leuthold et al., "Super Channels Based on Nyquist Multiplexing," 2012 17th Opto-Electronics and Communications Conference (OECC 2012) Technical Digest, Jul. 2012, Busan, Kor.
(Continued)

*Primary Examiner* — Nathan M Cors
(74) *Attorney, Agent, or Firm* — David L. Soltz

(57) ABSTRACT

Methods, systems, and apparatus, including computer programs encoded on computer storage media, for clock synchronizing an optical system and multiple leaf systems. In some implementations, an apparatus includes a receiver comprising: a local oscillator laser providing a local oscillator signal, a detector circuit operable to receive a first optical signal and detect first data carried by the first optical signal based on the local oscillator signal, a reference clock circuit supplying a clock signal, a digital signal processor (DSP) operable to receive the first data and supply a control signal to the reference clock circuit based on the first data, the reference clock circuit being operable to adjust the clock signal based on the control signal; and a transmitter operable to output a second optical signal carrying second data, the second data having an associated rate that is based on the clock signal.

20 Claims, 12 Drawing Sheets

(51) Int. Cl.
*H04J 14/02* (2006.01)
*H04L 7/00* (2006.01)

(56) References Cited

U.S. PATENT DOCUMENTS

| | | |
|---|---|---|
| 5,153,762 A | 10/1992 | Huber |
| 5,208,692 A | 5/1993 | McMahon |
| 5,596,436 A | 1/1997 | Sargis |
| 5,822,094 A | 10/1998 | O'Sullivan et al. |
| 5,825,857 A | 10/1998 | Reto |
| 6,046,838 A | 4/2000 | Kou |
| 6,362,913 B2 | 3/2002 | Ooi et al. |
| 6,525,857 B1 | 2/2003 | Way |
| 6,563,880 B1 | 5/2003 | Hunsinger et al. |
| 6,580,544 B1 | 6/2003 | Lin et al. |
| 6,687,044 B2 | 2/2004 | Paquet |
| 7,266,306 B1 | 9/2007 | Harley et al. |
| 7,466,919 B1 | 2/2008 | Birk et al. |
| 7,346,284 B2 | 3/2008 | Wan |
| 7,376,358 B2 | 5/2008 | Roberts et al. |
| 7,447,436 B2 | 11/2008 | Yee |
| 7,701,842 B2 | 4/2010 | Roberts et al. |
| 7,715,710 B2 | 5/2010 | Wan |
| 7,729,621 B2 | 6/2010 | Nahapetian et al. |
| 7,756,421 B2 | 7/2010 | Roberts |
| 7,826,752 B1 | 11/2010 | Zanoni |
| 8,184,992 B2 | 5/2012 | Kikuchi |
| 8,203,777 B2 | 6/2012 | Smith et al. |
| 8,412,047 B2 | 4/2013 | Tanaka |
| 8,437,645 B2 | 5/2013 | Boffi et al. |
| 8,472,810 B2 | 6/2013 | Akiyama |
| 8,477,056 B2 | 7/2013 | Sun et al. |
| 8,477,656 B2 | 7/2013 | O'Mahony |
| 8,478,137 B2 | 7/2013 | Komaki et al. |
| 8,655,190 B2 | 2/2014 | Wu et al. |
| 8,682,180 B1 | 3/2014 | Nimon et al. |
| 8,730,079 B2 | 5/2014 | Tudose |
| 8,768,177 B2 | 7/2014 | Wu et al. |
| 8,861,977 B2 | 10/2014 | McNicol |
| 8,929,750 B2 | 1/2015 | Ishihara |
| 8,965,203 B1 | 2/2015 | Vandat Amin |
| 8,971,723 B2 | 3/2015 | Le Taillandier De Gabory et al. |
| 8,989,593 B2 | 3/2015 | Sun et al. |
| 9,020,363 B2 | 4/2015 | Yasuda |
| 9,048,957 B2 | 6/2015 | Nakashima |
| 9,112,609 B2 | 8/2015 | Kim et al. |
| 9,154,231 B2 | 10/2015 | Kaneda |
| 9,166,692 B1 | 10/2015 | Felderman |
| 9,197,320 B2 | 11/2015 | Vassilieva |
| 9,244,928 B1 | 1/2016 | Nishimoto Hiroshi |
| 9,270,379 B2 | 2/2016 | Huang et al. |
| 9,281,915 B2 | 3/2016 | Kaneda |
| 9,363,585 B2 | 6/2016 | Carpini |
| 9,419,720 B2 | 8/2016 | Akiyama |
| 9,461,749 B2 | 10/2016 | Jansen et al. |
| 9,485,554 B1 | 11/2016 | Kim |
| 9,553,675 B2 | 1/2017 | Karar et al. |
| 9,608,866 B2 | 3/2017 | Nagarajan |
| 9,673,907 B1 | 6/2017 | Vassilieva |
| 9,686,020 B2 | 6/2017 | Mochizuki et al. |
| 9,705,592 B1 | 7/2017 | Schmogrow |
| 9,735,881 B1 | 8/2017 | Agazzi et al. |
| 9,991,953 B1 | 6/2018 | Fludger |
| 10,014,975 B2 | 7/2018 | Krause et al. |
| 10,027,424 B2 | 7/2018 | Zhuge et al. |
| 10,243,653 B2 | 3/2019 | Wiswell |
| 10,243,688 B2 | 3/2019 | Vassilieva |
| 10,348,410 B1 | 7/2019 | Charlton |
| 10,374,623 B1 | 8/2019 | Oveis Gharan |
| 10,374,721 B2 | 8/2019 | Awadalla |
| 10,389,447 B1 | 8/2019 | Khandani |
| 10,397,190 B2 | 8/2019 | Akhavain Mohammadi |
| 10,491,302 B1 | 11/2019 | Morris |
| 10,523,315 B2 | 12/2019 | Jiang |
| 10,547,388 B2 | 1/2020 | Ikeda |
| 10,574,362 B2 | 2/2020 | Chen |
| 10,587,358 B1 | 3/2020 | Ebrahimzad |
| 2002/0003641 A1 | 1/2002 | Hall |
| 2002/0005971 A1 | 1/2002 | Sasai |
| 2002/0034194 A1 | 3/2002 | Shattil Steve J |
| 2002/0067883 A1 | 6/2002 | Lo |
| 2002/0114038 A1 | 8/2002 | Arnon |
| 2002/0122518 A1 | 9/2002 | Yasuda et al. |
| 2002/0145783 A1 | 10/2002 | Chang |
| 2003/0020995 A1 | 1/2003 | Harasawa |
| 2003/0223751 A1 | 12/2003 | Shimizu |
| 2004/0016874 A1 | 1/2004 | Rao |
| 2004/0019459 A1 | 1/2004 | Dietz |
| 2004/0032643 A1 | 2/2004 | Chimfwembe |
| 2004/0033074 A1 | 2/2004 | Hsu |
| 2004/0105682 A1 | 6/2004 | Roberts |
| 2004/0197103 A1 | 7/2004 | Roberts |
| 2004/0151109 A1 | 8/2004 | Batra |
| 2004/0198265 A1 | 10/2004 | Wallace |
| 2004/0208614 A1 | 10/2004 | Price |
| 2004/0252996 A1 | 12/2004 | McNicol |
| 2005/0008085 A1 | 1/2005 | Lee |
| 2005/0074037 A1 | 4/2005 | Rickard |
| 2005/0111789 A1 | 5/2005 | Hayes |
| 2005/0147415 A1 | 7/2005 | Fee |
| 2005/0169585 A1* | 8/2005 | Aronson ............... H04B 10/40 385/89 |
| 2005/0175112 A1 | 8/2005 | Pisani Fabio |
| 2005/0175339 A1 | 8/2005 | Herskowits |
| 2006/0078336 A1 | 4/2006 | McNicol et al. |
| 2006/0093052 A1 | 5/2006 | Cho |
| 2006/0159454 A1 | 7/2006 | Bjornstad |
| 2006/0215540 A1 | 9/2006 | Krishnamoorthi |
| 2006/0233147 A1 | 10/2006 | Karabinis |
| 2006/0269295 A1 | 11/2006 | Way |
| 2006/0280510 A1 | 12/2006 | Onaka |
| 2007/0004465 A1 | 1/2007 | Papasakellariou |
| 2007/0025421 A1 | 2/2007 | Shattil |
| 2007/0092263 A1 | 4/2007 | Agazzi |
| 2008/0063409 A1 | 3/2008 | Toliver |
| 2008/0085125 A1 | 4/2008 | Frankel |
| 2008/0232816 A1 | 9/2008 | Hoshida |
| 2008/0267630 A1 | 10/2008 | Qian |
| 2009/0110033 A1 | 4/2009 | Shattil |
| 2009/0154336 A1 | 6/2009 | Green |
| 2009/0190929 A1 | 7/2009 | Khurgin |
| 2009/0196603 A1 | 8/2009 | Zhou |
| 2009/0214224 A1 | 8/2009 | Cho |
| 2009/0232234 A1 | 9/2009 | Du |
| 2009/0238578 A1 | 9/2009 | Taylor |
| 2009/0238580 A1 | 9/2009 | Kikuchi |
| 2009/0257344 A1 | 10/2009 | Huang |
| 2009/0257755 A1 | 10/2009 | Buelow |
| 2009/0092389 A1 | 11/2009 | Wei |
| 2010/0021163 A1 | 1/2010 | Shieh |
| 2010/0021166 A1 | 1/2010 | Way |
| 2010/0028002 A1 | 2/2010 | Qian |
| 2010/0086303 A1 | 4/2010 | Qian |
| 2010/0142964 A1 | 6/2010 | Chang et al. |
| 2010/0142967 A1 | 6/2010 | Perez |
| 2010/0178057 A1 | 7/2010 | Shieh |
| 2010/0189445 A1 | 7/2010 | Nakashima |
| 2010/0215368 A1 | 8/2010 | Qian |
| 2010/0246581 A1 | 9/2010 | Henry |
| 2010/0254707 A1 | 10/2010 | Peng |
| 2010/0329671 A1 | 12/2010 | Essiambre |
| 2010/0329683 A1 | 12/2010 | Liu |
| 2011/0097092 A1 | 4/2011 | Wagner et al. |
| 2011/0135301 A1 | 6/2011 | Myslinski |
| 2011/0142450 A1 | 6/2011 | Tanzi et al. |
| 2011/0150475 A1 | 6/2011 | Soto et al. |
| 2011/0176813 A1 | 7/2011 | Kim |
| 2011/0182577 A1 | 7/2011 | Wu |
| 2011/0249978 A1 | 10/2011 | Sasaki |
| 2011/0255870 A1 | 10/2011 | Grigoryan |
| 2012/0002703 A1 | 1/2012 | Yamashita |
| 2012/0033965 A1 | 2/2012 | Zhang |
| 2012/0045209 A1 | 2/2012 | Boyd |
| 2012/0082466 A1 | 4/2012 | Wu |

(56) References Cited

U.S. PATENT DOCUMENTS

| | | |
|---|---|---|
| 2012/0093510 A1 | 4/2012 | Zhang |
| 2012/0099864 A1 | 4/2012 | Ishihara |
| 2012/0141130 A1 | 6/2012 | Nakashima |
| 2012/0141135 A1 | 6/2012 | Yang |
| 2012/0148264 A1 | 6/2012 | Liu |
| 2012/0219285 A1 | 8/2012 | Dahan |
| 2012/0251119 A1 | 10/2012 | McNicol |
| 2012/0251121 A1 | 10/2012 | McNicol |
| 2012/0263471 A1 | 10/2012 | Buchali |
| 2012/0269510 A1 | 10/2012 | Hui |
| 2012/0269515 A1 | 10/2012 | Cvijetic |
| 2013/0070785 A1 | 3/2013 | Liu |
| 2013/0070786 A1 | 3/2013 | Liu |
| 2013/0101296 A1 | 4/2013 | Nishimoto |
| 2013/0108271 A1 | 5/2013 | Tang et al. |
| 2013/0136449 A1 | 5/2013 | Liu |
| 2013/0170834 A1 | 7/2013 | Cho et al. |
| 2013/0191877 A1 | 7/2013 | Rakib |
| 2013/0195452 A1 | 8/2013 | Hui |
| 2013/0202303 A1 | 8/2013 | Wilkinson |
| 2013/0251364 A1 | 9/2013 | Pachnicke |
| 2013/0286847 A1 | 10/2013 | Schmidt |
| 2014/0010543 A1 | 1/2014 | Lee |
| 2014/0056371 A1 | 2/2014 | Ji |
| 2014/0072303 A1* | 3/2014 | Pfau ................ H04J 14/0298 398/65 |
| 2014/0079390 A1 | 3/2014 | Kim |
| 2014/0079391 A1 | 3/2014 | Kim |
| 2014/0092924 A1 | 4/2014 | Krause et al. |
| 2014/0099116 A1 | 4/2014 | Bai |
| 2014/0126916 A1 | 5/2014 | Ota |
| 2014/0153925 A1 | 6/2014 | Nishihara et al. |
| 2014/0205286 A1 | 7/2014 | Ji et al. |
| 2014/0233963 A1 | 8/2014 | Le Taillandier De Gabory |
| 2014/0241727 A1* | 8/2014 | Lim .................. H04B 10/548 398/76 |
| 2014/0270759 A1 | 9/2014 | Djordjevic |
| 2014/0270761 A1 | 9/2014 | Xu |
| 2014/0270803 A1 | 9/2014 | Olsson |
| 2014/0294381 A1 | 10/2014 | McNicol |
| 2014/0314411 A1 | 10/2014 | Huang |
| 2014/0314416 A1 | 10/2014 | Vassilieva |
| 2014/0341587 A1 | 11/2014 | Nakashima |
| 2014/0363164 A1 | 12/2014 | Kim |
| 2014/0376930 A1 | 12/2014 | Shiba |
| 2015/0063808 A1 | 3/2015 | Xia |
| 2015/0071642 A1 | 3/2015 | Tanaka |
| 2015/0093118 A1 | 4/2015 | Jia |
| 2015/0098700 A1 | 4/2015 | Zhu |
| 2015/0117860 A1 | 4/2015 | Braun |
| 2015/0125160 A1 | 5/2015 | Wen |
| 2015/0188637 A1 | 7/2015 | Tanimura |
| 2015/0188642 A1 | 7/2015 | Sun |
| 2015/0229332 A1 | 8/2015 | Yuan |
| 2015/0229401 A1 | 8/2015 | Tanaka |
| 2015/0280853 A1 | 10/2015 | Sun |
| 2015/0288456 A1 | 10/2015 | Zhu |
| 2015/0289035 A1 | 10/2015 | Mehrvar |
| 2015/0296278 A1 | 10/2015 | Liu |
| 2015/0333860 A1 | 11/2015 | Rahn |
| 2016/0013881 A1 | 1/2016 | Rejaly et al. |
| 2016/0029403 A1 | 1/2016 | Roy et al. |
| 2016/0050021 A1 | 2/2016 | Hua |
| 2016/0057516 A1 | 2/2016 | Hochberg |
| 2016/0094292 A1 | 3/2016 | Mochizuki |
| 2016/0099777 A1 | 4/2016 | Liu |
| 2016/0112141 A1 | 4/2016 | Rahn |
| 2016/0142150 A1 | 5/2016 | Lyubomirsky |
| 2016/0191168 A1 | 6/2016 | Huang |
| 2016/0192042 A1 | 6/2016 | Mitchell |
| 2016/0197681 A1 | 7/2016 | Sun |
| 2016/0218812 A1 | 7/2016 | Okabe |
| 2016/0233963 A1 | 8/2016 | Zhuge et al. |
| 2016/0261347 A1 | 9/2016 | Karar |
| 2016/0277816 A1 | 9/2016 | Yuang |
| 2016/0316281 A1 | 10/2016 | Keyworth |
| 2016/0323039 A1 | 11/2016 | Sun et al. |
| 2017/0005747 A1 | 1/2017 | Kim |
| 2017/0019168 A1 | 1/2017 | Menard |
| 2017/0033864 A1 | 2/2017 | Nagarajan |
| 2017/0033999 A1 | 2/2017 | Nagarajan et al. |
| 2017/0041691 A1 | 2/2017 | Rickman |
| 2017/0054513 A1 | 2/2017 | Guo |
| 2017/0070313 A1 | 3/2017 | Kato |
| 2017/0078028 A1 | 3/2017 | Zhang |
| 2017/0078044 A1 | 3/2017 | Hino |
| 2017/0104535 A1 | 4/2017 | Hoshida |
| 2017/0134836 A1 | 5/2017 | Sindhy Pradeep |
| 2017/0149507 A1 | 5/2017 | Le Taillandier De Gabory |
| 2017/0163347 A1 | 6/2017 | Akiyama |
| 2017/0222716 A1 | 8/2017 | Nakashima |
| 2017/0237500 A1 | 8/2017 | Nishimoto |
| 2017/0250775 A1 | 8/2017 | Kato |
| 2017/0324480 A1 | 11/2017 | Elmirghani |
| 2017/0366267 A1 | 12/2017 | Campos |
| 2017/0367061 A1 | 12/2017 | Kim |
| 2018/0034555 A1 | 2/2018 | Goh |
| 2018/0115407 A1 | 4/2018 | Melikyan |
| 2018/0120520 A1 | 5/2018 | Kelly |
| 2018/0145761 A1 | 5/2018 | Zhuge |
| 2018/0198547 A1* | 7/2018 | Mehrvar ................ H04B 10/25 |
| 2018/0219632 A1 | 8/2018 | Yoshida |
| 2018/0234285 A1 | 8/2018 | Djordjevic |
| 2018/0241476 A1 | 8/2018 | Johnson |
| 2018/0278331 A1 | 9/2018 | Cao |
| 2018/0324717 A1 | 11/2018 | Zhou |
| 2018/0359047 A1 | 12/2018 | Vassilieva |
| 2019/0020409 A1 | 1/2019 | Le Taillandier De Gabory |
| 2019/0097728 A1 | 3/2019 | Frankel |
| 2019/0123819 A1 | 4/2019 | Jiang |
| 2019/0149242 A1 | 5/2019 | Torbatian |
| 2019/0149389 A1 | 5/2019 | Torbatian |
| 2019/0253153 A1 | 8/2019 | Sun |
| 2019/0260493 A1 | 8/2019 | Chimfwembe Patrick Chilufya |
| 2019/0288777 A1 | 9/2019 | Ishimura |
| 2019/0312640 A1 | 10/2019 | Binkai |
| 2020/0076508 A1 | 3/2020 | Jia |
| 2020/0177525 A1 | 6/2020 | Morris |

FOREIGN PATENT DOCUMENTS

| | | |
|---|---|---|
| WO | WO 2012100714 | 8/2012 |
| WO | WO 2014114332 | 7/2014 |

OTHER PUBLICATIONS

S. Watanabe et al., "Optical Coherent Broad-Band Transmission for Long-Haul and Distribution Systems Using Subcarrier Multiplexing," Journal of Lightwave Technology, vol. 11, No. 1, Jan. 1993, pp. 116-127.

M. Jinno et al., "Demonstration of Novel Spectrum-Efficient Elastic Optical Path Network with Per-Channel Variable Capacity of 40 Gb/s to Over 400 Gb/s," ECOC 2008, Sep. 21-25, 2008, Brussels, Belgium, Th.3.F.6.

Y. Chen Et Al., "Experimental Demonstration of Roadm Functionality on an Optical SCFDM Superchannel," IEEE Photonics Technology Letters, vol. 24, No. 3, Feb. 1, 2012, pp. 215-217.

Adaptive Software Defined Terabit Transceiver for Flexible Optical Networks, Public executive summary of the Final Project Periodic Report, Jun. 16, 2016.

Hillerkus, Single-Laser Multi-Terabit/s Systems, KIT Scientific Publishing, 2013, Chapters 1, 3, and 6.

Hu et al., "Flexible and Concurrent All-Optical VPN in OFDMA PON," IEEE Photonics Technology Journal, vol. 5, No. 6, Dec. 2013.

Bosco et al., "On the Performance of Nyquist-WDM Terabit Superchannels Based on PM-BPSK, PM-QPSK, PM-8QAM or PM-16QAM Subcarriers," Journal of Lightwave Technology, vol. 29, No. 1, Jan. 1, 2011, pp. 53-60.

K. Roberts et al., "Flexible Transceivers," ECOC Technical Digest, 2012, We.3.A.3.

(56) References Cited

OTHER PUBLICATIONS

K. Roberts et al., "High Capacity Transport-100G and Beyond," Journal of Lightwave Technology, vol. 33, No. 3, Feb. 1, 2015, pp. 563-578.
J. Reis et al., "Performance Optimization of Nyquist Signaling for Spectrally Efficient Optical Access Networks [Invited]," J. Opt. Commun. Netw./vol. 7, No. 2, Feb. 2015, pp. A200-A208.
R. Ferreira et al, Coherent Nyquist UDWDM-PON With Digital Signal Processing in Real Time, Journal of Lightwave Technology, vol. 34, No. 2, Jan. 15, 2016, pp. 826-833.
A. Shahpari et al., "Coherent Access: A Review", Journal of Lightwave Technology, vol. 35, No. 4, Feb. 15, 2017, pp. 1050-1058.
P. Layec et al., "Rate-Adaptable Optical Transmission and Elastic Optical Networks," Chapter 15, Enabling Technologies for High Spectrak-effiency Coherent Optical Communication Networks, First Edition, 2016 John Wiley & Sons, Inc. Published 2016, pp. 507-545.
J. Altabas, "Cost-effective Transceiver based on a RSOA and a VCSEL for Flexible uDWDM Networks," IEEE Photonics Technology Letters ( vol. 28, Issue: 10, May 15, 2016, pp. 1111-1114.
K. Roberts et al., "Beyond 100 Gb/s: Capacity, Flexibility, and Network Optimization," J. Opt. Commun. Netw./vol. 9, No. 4/Apr. 2017 pp. C12-24.
Lavery et al., "Digital Coherent Receivers for Long-Reach Optical Access Networks," Journal of Lightwave Technology, vol. 31, No. 4, Feb. 15, 2013, pp. 609-620.
V. Vujicic, "Optical Multicarrier Sources for Spectrally Efficient Optical Networks," a Dissertation submitted in fulfilment of the requirements for the award of Doctor of Philosophy (Ph.D.) to the Dublin City University, Dec. 2015, Chapters 1, 2, and 6.
Straullu et al., "Single-Wavelength Downstream FDMA-PON at 32 Gbps and 34 dB ODN Loss," IEEE Photonics Technology Letters, vol. 27, No. 7, Apr. 1, 2015, pp. 774-777.
Y. Zhang et al., "Digital subcarrier multiplexing for flexible spectral allocation in optical transport network," Oct. 24, 2011/vol. 19, No. 22/Optics Express 21882.
R. Schmogrow et al., "Nyquist Frequency Division Multiplexing for Optical Communications," CLEO Technical Digest, OSA 2012, CTh1H.2.
P Khodashenas. "Investigation of Spectrum Granularity for Performance Optimization of Flexible Nyquist-WDM-Based Optical Networks." Journal of Lightwave Technology, vol. 33, No. 23, Dec. 1, 2015 pp. 4767-4774.
Mishra et al., "Flexible RF-Based Comb Generator," IEEE Photonics Technology Letters, vol. 25, No. 7, Apr. 1, 2013, pp. 701-704.
M. Jinno et al., "Multiflow Optical Transponder for Efficient Multilayer Optical Networking," IEEE Communications Magazine ● May 2012, pp. 56-65.
Kim Roberts, "100G and Beyond," OFC 2014, OSA 2014, Tu3J.1.
J. Fischer, "Digital signal processing for coherent UDWDM passive optical networks," ITG-Fachbericht 248: Photonische Netze 05. Jun. 5, 2014 in Leipzig, VDE VERLAG GMBH • Berlin • Offenbach, Germany, Isbn 978-3-8007-3604-1.
Kottke et al., "Coherent UDWDM PON with joint subcarrier reception at OLT," Optics Express, Jul. 2, 2014.
Lavery et al., "Reduced Complexity Equalization for Coherent Long-Reach Passive Optical Networks," J. Opt. commun. Netw./vol. 7, No. 1/Jan. 2015, pp. A16-A27.
Lazaro et al., "Flexible PON Key Technologies: Digital Advanced Modulation Formats and Devices," 2014 16th International Conference on Transparent Optical Networks (ICTON), Tu.B3.2.
Optical Internetworking Forum—Technology Options for 400G Implementation 01F-Tech-Options-400G-01.0, Jul., 2015.
Riccardi et al., "Sliceable bandwidth variable transponder: The Idealist vision," 2015 European Conference on Networks and Communications (EuCNC), pp. 330-334.
Sambo et al., "Next Generation Sliceable Bandwidth Variable Transponders," IEEE Communications Magazine, Feb. 2015, pp. 163-171.
P. Schindler et al., "Colorless Fdma-Pon With Flexible Bandwidth Allocation and Colorless, Low-Speed ONUs [Invited]," J. Opt. Commun. Netw./vol. 5, No. 10/Oct. 2013, pp. A204-A212.
Schmogrow et al., "Real-time Nyquist signaling with dynamic precision and flexible non-integer oversampling," Jan. 13, 2014 | vol. 22, No. 1 | D01:10.1364/0E.22.000193 | Optics Express 193.
Schmogrow et al., "Real-Time Digital Nyquist-WDM and OFDM Signal Generation: Spectral Eddiciency Versus DSP Complexity," ECOC Technical Digest, 2012, OSA Mo.2.A.4.
Boutaba et al., "Elastic Optical Networking for 5G Transport," J Netw Syst Manage (2017) 25m pp. 819-847 123.
S. Smolorz et al., "demonstration of a Coherent UDWDM-OIN with Real-Time Processing,"OFC/NFOEC 2011, PDPD4.
H. Rohde et al. "Coherent Ultra Dense WDM Technology for Next Generation Optical Metro and Access Networks," Journal Of Lightwave Technology, vol. 32, No. 10, May 15, 2014 pp. 2041-2052.
Ze Dong et al., "Very-High-Throughput Coherent Ultradense WDM-OIN Based on Nyquist-ISB Modulation," IEEE Photonics Technology Letters, vol. 27, No. 7, Apr. 1, 2015, pp. 763-766.
Rohde et al., "Digital Multi-Wavelenght Generation and Real Time Video Transmission in a Coherent Ultra Dense WDM PON," OFC/NFOEC Technical Digest, 2015 OSA, OM3H.3.

* cited by examiner

SYNCHRONIZATION FOR SUBCARRIER COMMUNICATION

CROSS REFERENCE TO RELATED APPLICATION(S)

This application claims the benefit of U.S. Provisional Patent Application No. 62/836,354, filed Apr. 19, 2019, which is incorporated herein by reference in its entirety.

BACKGROUND

This specification relates generally to synchronization between components of optical systems.

Some optical system components communicate with one another by transmitting multiplexed subcarriers. However, technical challenges arise when a receiving optical system component attempts to process a particular one of the received multiplexed subcarriers. For example, each subcarrier in the received multiplexed subcarriers may be transmitted at its own respective frequency rate, thus inhibiting the optical system component's ability to process each received subcarrier properly.

SUMMARY

In one aspect, in accordance with some implementations, the specification describes techniques related to clock synchronizing an optical system and multiple leaf systems. The optical system and the multiple leaf systems can transmit data bi-directionally between one another through an intermediary system. The optical system can broadcast data at a high data rate to multiple leaf systems through the intermediary system. Further, each leaf system can transmit data upstream to the intermediary system, which aggregates the received data from each leaf system and transmits the aggregated data to the optical system.

The optical system and the multiple leaf systems can use coherent detection to facilitate combining and processing multiple data streams. In coherent detection, the optical and multiple leaf systems rely on digital signal processing techniques to track phase and frequency information, e.g., transmitted phase and transmitted frequency, of the data stream. Thus, transmitted data can be aggregated, e.g., multiplexed, with other sets of transmitted data and properly detected and demodulated at the receiving end. For example, the optical system can digitally multiplex signals each of which uses a different respective subcarrier and transmit the digitally multiplexed signals to an intermediary server. The intermediary server can receive the digitally multiplexed subcarriers and power split each of the digitally multiplexed subcarriers to each leaf system, such that each leaf system receives all the digitally multiplexed subcarriers. Each leaf system can tune its respective receiver to demodulate one subcarrier from the digitally multiplexed subcarriers coherently.

In some implementations, the leaf system may receive a subcarrier that was not transmitted at the desired transmit frequency. The misaligned transmit frequency of the subcarrier can occur, for example, due to errors in the optical fiber or a misaligned transmit clock frequency at the optical engine, or may be caused by other extraneous factors. For example, the receiver may detect that the subcarrier was transmitted at 5.01 gigahertz (GHz) rather than the expected 5.00 GHz. The leaf system's receiver detects the error and takes action to lock onto the actual transmit frequency of the incoming subcarrier. In particular, the action can include adjusting a frequency at which the incoming subcarrier is sampled such that the receiver is directly tuned to the actual transmit frequency. This process can occur iteratively such that the receiver of each leaf system is tuned to the transmit clock frequency of a respective subcarrier from the optical system. The leaf system is then considered to be clock synchronized or "frequency locked" to the optical system.

Once the leaf system is clock synchronized to the optical system, the leaf system can use the locked clock frequency to transmit data, e.g., using a single subcarrier, upstream to the optical system. Each of the leaf systems may carry out this frequency locking procedure such that the respective subcarriers transmitted by the leaf systems are appropriately frequency-separated and do not interfere with one another. This process assumes the tightly spaced subcarriers transmitted by the optical system are appropriately frequency-separated. Consequently, the leaf systems also can avoid subcarrier collision because each leaf system transmits a subcarrier at a corresponding clock frequency based on a respective subcarrier frequency that is output from the optical system.

Thus, if the optical system adjusts a transmit frequency for any of its transmitted subcarriers, then a corresponding leaf system will detect the adjusted transmit frequency coherently, and adjust its transmit frequency accordingly. In particular, the leaf system that receives the subcarrier at the adjusted transmit frequency also will transmit a subcarrier to the optical subsystem at the adjusted transmit frequency. In this manner, the intermediary system can receive the subcarriers from each leaf system and avoid spectral overlap during frequency multiplexing of the received subcarriers. The intermediary system then can transmit the frequency-multiplexed subcarriers to the optical system for proper detection and demodulation.

In a general aspect, the specification describes an apparatus that includes: a receiver including: a local oscillator laser providing a local oscillator signal, a detector circuit operable to receive a first optical signal and detect first data carried by the first optical signal based on the local oscillator signal, a reference clock circuit supplying a clock signal, a digital signal processor (DSP) operable to receive the first data and supply a control signal to the reference clock circuit based on the first data, the reference clock circuit being operable to adjust the clock signal based on the control signal; and a transmitter operable to output a second optical signal carrying second data, the second data having a second data rate that is based on the clock signal.

Particular implementations may include one or more of the following features. For example, in some implementations, the first data is carried by a plurality of subcarriers at a first data rate, and each subcarrier carries a respective portion of the first data at the second data rate, wherein the second data rate is different from the first data rate.

In some implementations, the clock signal comprises a frequency that matches the second data rate.

In some implementations, the apparatus is provided in a leaf node and the first optical signal is transmitted from a hub node, the first data having a first data rate and the second data having the second data rate, the second data rate being synchronized to the first data rate.

In some implementations, the clock signal is a first clock signal, the apparatus further including: a photodiode circuit that supplies an electrical signal based on the first optical signal; an analog-to-digital converter (ADC); and a voltage controlled oscillator (VCO) operable to receive the first clock signal from the reference clock circuit and provide a second clock signal to the ADC, the ADC operable to generate a digital signal based on the electrical signal and the second clock signal, the digital signal being provided to the DSP.

In a general aspect, an apparatus include: a receiver including: a local oscillator laser providing a local oscillator signal, a detector circuit operable to receive a first optical signal and detect a first portion of a first data stream carried by the first optical signal based on the local oscillator signal, a reference clock circuit supplying a clock signal, a first digital signal processor (DSP) operable to receive the first portion of the first data stream and supply a control signal to the reference clock circuit based on the first portion of the first data stream, the reference clock circuit being operable to adjust the clock signal based on the control signal; and a transmitter comprising: a second DSP; and a modulator supplying a second optical signal based on an output of the second DSP, such that the clock signal is supplied to the first and second DSPs, wherein the first DSP processes a second portion of the first data stream based on the clock signal and the second DSP supplies the output based on the clock signal.

In some implementations, the first DSP is operable to determine whether a clock phase error associated with the detected first portion of the first data stream is below a predetermined threshold; and in response to the first DSP determining the clock phase error associated with the detected first portion of the first data stream is below the predetermined threshold, the apparatus is operable to transmit third data to an optical system based on the clock signal.

In some implementations, the first portion of the first data stream is carried by a plurality of subcarriers at a first data rate, and each subcarrier carries a respective portion of the first portion at a second data rate, wherein the second data rate is different from the first data rate.

In some implementations, the reference clock circuit is operable to supply the clock signal to the first DSP and the second DSP at a frequency that matches the second data rate to synchronize the clock signal of a leaf system to the second data rate of the optical system.

In some implementations, the apparatus includes at least one analog-to-digital converter (ADC); a voltage controlled oscillator (VCO) being operable to receive the clock signal from the reference clock circuit and provide a second clock signal to the at least one ADC; the at least one ADC being operable to receive an analog signal from the optical system, convert the analog signal to a digital signal based on the second clock signal provided by the VCO, and provide the digital signal to the first DSP; and the first DSP being operable to receive the digital signal from the at least one ADC, process the digital signal, generate the control signal based on the processed digital signal, and supply the control signal to the reference clock circuit.

In some implementations, the apparatus includes at least one digital-to-analog converter (DAC); a voltage controlled oscillator (VCO) being operable to receive the clock signal from the reference clock circuit and provide a second clock signal to the at least one DAC; the at least one DAC being operable to receive a digital signal from the second DSP, convert the digital signal to an analog signal based on the second clock signal provided by the VCO, and provide the analog signal to the optical system; and the second DSP being operable to provide the digital signal to the at least one DAC and receive the second clock signal provided by the VCO.

In a general aspect, a system includes: an optical system operable to transmit optical signals at a first data rate; one or more leaf systems; an intermediary system; the intermediary system operable to receive the optical signals and broadcast the optical signals to each of the one or more leaf systems; and wherein each of the one or more leaf systems comprises: a receiver comprising: a local oscillator laser providing a local oscillator signal, a detector circuit operable to receive a first optical signal and detect first data carried by the first optical signal based on the local oscillator signal, a reference clock circuit supplying a clock signal, a digital signal processor (DSP) operable to receive the first data and supply a control signal to the reference clock circuit based on the first data, the reference clock circuit being operable to adjust the clock signal based on the control signal; and a transmitter operable to output a second optical signal carrying second data, the second data having a second data rate that is based on the clock signal.

In some implementations, the system further includes: a photodiode circuit that supplies an electrical signal based on the first optical signal; an analog-to-digital converter (ADC); a first voltage controlled oscillator (VCO) operable to receive the clock signal from the reference clock circuit and to provide a second clock signal to the ADC; the ADC operable to receive an analog signal from the optical system, generate a digital signal based on the analog signal using the second clock signal provided by the first VCO, and provide the digital signal to the DSP; and the DSP is operable to receive the digital signal from the ADC, process the digital signal, generate the control signal based on the processed digital signal, and supply the control signal to the reference clock circuit.

In some implementations, the system further includes: a digital-to-analog converter (DAC); a second DSP; a second voltage controlled oscillator (VCO) being operable to receive the clock signal from the reference clock circuit and provide a third clock signal to the DAC; the DAC operable to receive a second digital signal from the second DSP, convert the second digital signal to a second analog signal based on the third clock signal provided by the second VCO, and provide the analog signal to the optical system; and the second DSP being operable to provide the digital signal to the DAC and receive the third clock signal provided by the second VCO.

In some implementations, the third clock signal provided by the second VCO matches the second clock signal provided by the first VCO.

In some implementations, the third clock signal and the second clock signal instruct the DAC and the ADC to sample at the same frequency.

In some implementations, each of the one or more leaf systems includes: a client processing module operable to adjust a frequency of the clock signal to a second clock frequency to provide client data at the second clock frequency to other devices within the one or more leaf systems that process the client data at the second clock frequency.

In some implementations, the system includes a serializer/deserializer (SERDES), wherein: the client processing module is operable to transmit the client data at the second clock frequency to the SERDES and adjust a frequency of a client side clock signal associated with a client side reference clock; and the SERDES is operable to transmit the client data at the second clock frequency to the other devices and to receive the client side clock signal from the client side reference clock.

In some implementations, the intermediary system is operable to receive the analog signal from each of the one or more leaf systems, multiplex the received analog signal from each of the one or more leaf systems, and provide the multiplexed analog signal to the optical system.

In some implementations, the clock signal comprises a frequency that matches the second data rate.

In a general aspect, a method includes: receiving first data from an optical system; detecting the first data using a local oscillator signal provided by a local oscillator laser; processing the first data using a first sampling rate; adjusting a frequency of a clock signal supplied by a reference clock based on the processed first data; and transmitting second data to the optical system at a rate based on the clock signal.

In some implementations, wherein the first data is carried by a plurality of subcarriers at a first data rate, and each subcarrier carries a respective portion of the first data at a second data rate, wherein the second data rate is different from the first data rate.

In some implementations, the clock signal comprises a frequency that matches the second data rate.

In some implementations, a portion of the first data corresponds to a subcarrier from the plurality of subcarriers and the frequency of the clock signal corresponds to the first data rate.

In some implementations, the method further includes: supplying the clock signal to a first digital signal processor (DSP) and a second DSP at the frequency that matches the second data rate to synchronize the clock signal of a leaf system to the second data rate of the second data.

In some implementations, adjusting the frequency of the clock signal supplied by the reference clock based on the processed first data includes: detecting a phase error associated with the processed first data; generating a supply signal that corresponds to the frequency of the clock signal to correct the phase error; and providing the supply signal to the reference clock.

In a general aspect, a method includes: receiving a first modulated optical signal and local oscillator light; supplying optical mixing products based on the first modulated optical signal and the local oscillator light; supplying an electrical signal based on the optical mixing products; supplying digital signals based on the electrical signals; generating a supply signal based on the digital signals; providing the supply signal to a reference clock circuit for generating a clock signal; and supplying a second modulated optical signal, wherein a timing of data carried by the second modulated optical signal is based on the clock signal.

In some implementations, the first modulated optical signal includes a plurality of optical subcarriers.

In some implementations, each of the plurality of optical subcarriers is a Nyquist subcarrier.

In some implementations, the first modulated optical signal includes a plurality of first optical subcarriers, and the second modulated optical signal includes at least a second optical subcarrier.

In some implementations, the method further includes: supplying, by a laser, an optical output, wherein the local oscillator light includes a first portion of the optical output; and modulating, by a modulator, a second portion of the optical output to provide the first modulated optical signal.

In a general aspect, a method includes: receiving a plurality of first optical subcarriers carried by a first modulated optical signal; generating a clock signal based on first data carried by at least one of the plurality of first optical subcarriers, each of the plurality of first optical subcarriers not spectrally overlapping with one another; and generating at least one second optical subcarrier based on the clock signal, wherein the second optical subcarrier carries second data at a rate based on the clock signal.

In some implementations, the second data is synchronized with the first data.

In some implementations, the first modulated optical signal includes sixteen optical subcarriers.

In some implementations, each subcarrier of the plurality of first optical subcarriers is a Nyquist subcarrier.

In some implementations, the first modulated optical signal includes a plurality of first optical subcarriers.

In some implementations, the method further includes: transmitting a second modulated optical signal including the at least one second optical subcarrier.

In some implementations, the method further includes: supplying, by a laser, a local oscillator light, wherein the local oscillator light includes a first portion of an optical output; and modulating, by a modulator, a second portion of the optical output to provide the first modulated optical signal.

In some implementations, the method further includes: determining whether a clock phase error associated with the first data carried by the at least one of the plurality of first optical subcarriers is below a predetermined threshold; and in response to determining the clock phase error associated with the first data carried by the at least one of the plurality of first optical subcarriers is below the predetermined threshold, transmitting the at least one second optical subcarrier to an optical system based on the clock signal.

In some implementations, transmitting the at least one second optical subcarrier to the optical system based on the clock signal further includes: transmitting the at least one second optical subcarrier to the optical system based on the clock signal through an intermediary system that couples the optical system to one or more leaf systems.

In a general aspect, a transceiver includes: a receiver including: an optical hybrid circuit operable to receive a first modulated optical signal and local oscillator light, the optical hybrid circuit being operable to supply optical mixing products based on the first modulated optical signal and the local oscillator light, a photodiode circuit operable to supply an electrical signal based on the optical mixing products, analog-to-digital conversion (ADC) circuitry operable to supply digital signals based on the electrical signal, and a digital signal processor operable to generate a supply signal based on the digital signals and provide the supply signal to a reference clock circuit for generating a clock signal; and a transmitter operable to output a second modulated optical signal, a timing of data carried by the second modulated optical signal being based on the clock signal.

In some implementations, the first modulated optical signal includes a plurality of optical subcarriers.

In some implementations, each of the plurality of optical subcarriers is a Nyquist subcarrier.

In some implementations, the first modulated optical signal includes a plurality of first optical subcarriers, and the second modulated optical signal includes at least a second optical subcarrier.

In some implementations, the method further includes: a laser operable to provide an optical output; and a modulator, wherein the local oscillator light include a first portion of the optical output, and the modulator modulates a second portion of the optical output to provide the second modulated optical signal.

In a general aspect, a transceiver includes: a receiver that receives a plurality of first optical subcarriers carried by a first modulated optical signal; circuitry provided in the receiver operable to generate a clock signal based on first data carried by at least one of the plurality of first optical subcarriers, each of the plurality of first optical subcarriers not spectrally overlapping with one another; and a transmitter generating at least one second optical subcarrier and receiving the clock signal, the second optical subcarrier carrying second data at a rate based on the clock signal.

In some implementations, the second data is synchronized with the first data.

In some implementations, the first modulated optical signal includes sixteen optical subcarriers.

In some implementations, each subcarrier of the plurality of first optical subcarriers is a Nyquist subcarrier In some implementations, the transceiver further includes: a laser operable to provide an optical output; and a modulator, wherein the local oscillator light include a first portion of the optical output, and the modulator modulates a second portion of the optical output to provide the second modulated optical signal.

In a general aspect, a transceiver includes: a receiver including: a local oscillator laser providing a local oscillator signal, a detector circuit operable to receive an optical signal from an optical system and detect first data carried by the optical signal based on the local oscillator signal, a reference clock circuit supplying a clock signal, a digital signal processor (DSP) operable to receive the first data and supply a control signal to the reference clock circuit based on the first data, the reference clock circuit being operable to adjust the clock signal based on the control signal; and a transmitter operable to output a second optical signal carrying second data, the second data having a second data rate that is based on the clock signal.

In some implementations, the optical signal includes a plurality of subcarriers, and the first data is carried by the plurality of subcarriers at a first data rate, and each subcarrier in the plurality of subcarriers carries a respective portion of the first data at a second data rate, wherein the second data rate is different from the first data rate.

In some implementations, the second data rate is less than the first data rate.

In some implementations, the adjusted clock signal comprises a frequency that matches the second data rate.

In some implementations, the transceiver is provided in a leaf node and the optical system is transmitted from a hub node, the first data having a first data rate and the second data having a second data rate, the second data rate being synchronized to the first data rate.

In some implementations, the clock signal is a first clock signal, the transceiver further including: a photodiode circuit that supplies an electrical signal based on the optical signal; an analog-to-digital converter (ADC); and a voltage controlled oscillator (VCO) operable to receive the first clock signal from the reference clock circuit and provide a second clock signal to the ADC, the ADC operable to generate a digital signal based on the electrical signal and the second clock signal, the digital signal being provided the digital signal to the DSP.

In some implementations, the transceiver further includes: a digital-to-analog converter (DAC); a second DSP; a second voltage controlled oscillator (VCO) being operable to receive the clock signal from the reference clock circuit and provide a third clock signal to the DAC; the DAC operable to receive a second digital signal from the second DSP, convert the second digital signal to a second analog signal based on the third clock signal provided by the second VCO, and provide the second analog signal to the optical system; and the second DSP being operable to provide the digital signal to the DAC and receive the third clock signal provided by the second VCO.

In some implementations, the third clock signal provided by the second VCO matches the second clock signal provided by the first VCO.

Implementations of the above techniques include methods, apparatus, systems, and computer program products. One such computer program product is suitably embodied in a non-transitory machine-readable medium that stores instructions executable by one or more processors. The instructions are configured to cause the one or more processors to perform the above-described actions.

The details of one or more implementations of the subject matter of this specification are set forth in the accompanying drawings and the description below. Other aspects, features and advantages will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
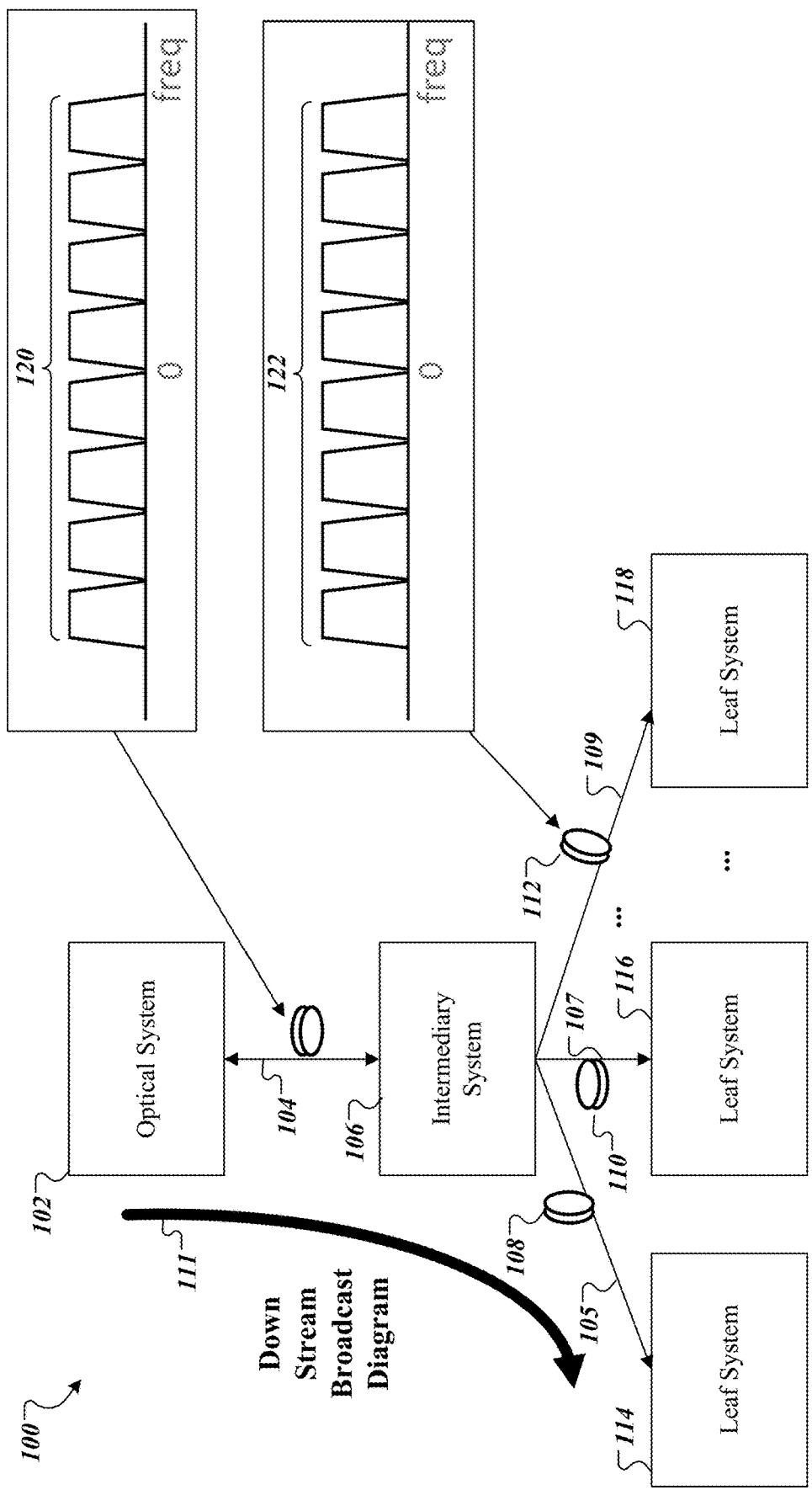
FIG. 1A is a block diagram that illustrates an example of a system for down-stream broadcasting data from an optical system to multiple leaf systems.

In some implementations, the system described here implements techniques for synchronizing data transmission between an optical system and multiple leaf systems. During a downstream broadcast, for example, the optical system can transmit information using multiple subcarriers to the leaf systems through an intermediary system. In the reverse direction, e.g., in an upstream transmission, each leaf system can transmit information using a respective subcarrier to the intermediary system, which digitally multiplexes the received subcarriers and places the digitally multiplexed subcarriers on an optical fiber for receipt at the optical system.

The multiple leaf systems can "frequency lock" to a transmit clock frequency of a received subcarrier during the downstream broadcast. In particular, each leaf system's receiver may frequency-lock to the transmit clock frequency of the received subcarrier by adjusting sampling rates of analog-to-digital converters (ADCs) based on a detected clock frequency rate of the received subcarrier. Once the receiver no longer detects an error in the clock frequency rate, the corresponding leaf system is in "frequency lock." This process will be described in further detail below. Each leaf system can perform this frequency locking process in conjunction with a respective subcarrier transmitted by the optical system.

In response to each of the multiple leaf systems frequency locking to the transmission rate of a respective subcarrier from the optical system, the multiple leaf systems can transmit data in an upstream broadcast, e.g., from the leaf system to the optical system, such that the data from each leaf system does not interfere with one another. In particular, each leaf system transmits a subcarrier to the intermediary system at a clock frequency rate that matches a clock frequency rate of a respective subcarrier transmitted by the optical system. Each subcarrier, which a leaf system transmits at a different clock frequency rate, will not spectrally overlap with subcarriers of the other leaf systems. Thus, when the intermediary system receives each subcarrier, the received subcarriers will not interfere with one another because adjacent subcarriers, e.g., subcarriers having adjacent clock frequency rates, may be spectrally spaced apart from one another by a relatively small frequency gap to allow for wave-locking interaction. Therefore, when the intermediary system frequency multiplexes each received subcarrier, the subcarriers do not overlap, and the intermediary system supplies the digitally multiplexed carriers to the optical system for demodulation.

In general, in optical communication systems, wavelength division multiplex (WDM) are systems in which multiple optical signals, each having a different wavelength, can be combined into a single optical communication channel, e.g., an optical fiber, using an optical multiplexer circuit (referred to as a "multiplexer"). These optical communication systems can include a transmitter circuit, such as a transmitter (TX) photonic integrated circuit (PIC). The TX PIC can include a laser system. The laser system can provide a laser signal associated with each wavelength to a modulator configured to modulate the output of the laser. Additionally, the TX PIC can include a multiplexer to combine each of the modulated outputs, e.g., to form a combined output or WDM signal, and a gain-sharing module to disperse the bit error rate effects due to path loss on the transmission channel across the subcarriers in the time domain.

In some implementations, the WDM communication system also includes a receiver, such as a receiver (RX) PIC and an optical de-multiplexer circuit. The de-multiplexer circuit is configured to receive the combined output from the receiver and de-multiplex the combined output to provide individual signals, e.g., a set of subcarriers. Additionally, the receiver can include additional receiver components, such as an analog-to-digital converter (ADC), a forward error correction (FEC) decoder, and an interleaver, to name a few examples, to convert the optical signals into voltage values and generate de-interleaved and decoded data from the voltage values.

A PIC is a device that integrates multiple photonic functions on a single integrated circuit device. In some implementations, the PIC can be fabricated in a manner similar to electronic integrated circuits, but may be fabricated using one or more of a variety of material types, such as for example, silica on silicon, silicon on insulator, or various polymers, and other semiconductor materials, which are used to make semiconductor lasers, such as GaAs and InP.

The TX and RX PICs, in an optical communication system, may support communications over a wide range of wavelength channels. For example, a pair of TX/RX PICS may support ten channels, each spaced apart, for example, by 50 GHz to 200 GHz, depending upon the design of the system. The set of channels supported by the TX and RX pics can be referred to as the channel "grid" for the PICs. Channel grids for TX/RX PICs may be aligned to standardized frequencies, such as those published by the Telecommunication Standardization Sector (ITU-T). The set of channels supported by the TX and RX PICs may be referred to as the ITU frequency grid for the TX/RX PICs. The spacing, between the channels, may be less than 200 GHz, for example, in order to pack the channels together to form a super channel.

FIG. 1A is a block diagram that illustrates an example of a system for down-stream broadcasting data from an optical system to multiple leaf systems. System 100 includes an optical system 102, an intermediary system 106 (referred to as "hub node"), and leaf systems 114, 116, and 118 (collectively referred to as "leaf systems" or "leaf nodes" or individually referred to as a "leaf system" or a "leaf node"). In particular, the optical system 102 can transmit data in a downstream broadcast in the optical communication path 111. Additionally, the system 100 can operate in the reverse direction in which the optical system 102 can receive data in an upstream direction. The upstream direction will be further described with respect to FIG. 1B.

In some implementations, the optical system 102 includes one or more components that generate a high data rate signal. For example, the optical system 102 can receive input data, and can include a local oscillator, a coherent hybrid detector, a coherent DSP, and a line side reference clock as described in further detail below. In some examples, the optical system 102 includes a local oscillator, a line side reference lock, and multiple of sets of the coherent hybrid detector and the coherent DSP. The optical system 102 can include the multiple sets of the coherent hybrid detector and the coherent DSP for transmitting multiple subcarriers at a high data rate. In some implementations, the subcarriers are Nyquist subcarriers, which are a group of optical signals, each carrying data, wherein (i) the spectrum of each such optical signal within the group is sufficiently non-overlapping such that the optical signals remain distinguishable from each other in the frequency domain, and (ii) such group of optical signals is generated by modulation of light from a single laser. In some instances, the optical system 102 can generate eight subcarriers, each subcarrier carrying 100 gigabits (Gbits) worth of data, for a total of 800 Gbits of data to transmit. In another example, the optical system 102 may generate 16 subcarriers, each subcarrier carrying 50 Gbits worth of data, for a total of 800 Gbits of data to transmit. These values may vary for other implementations.

The optical system 102 can perform digital multiplexing in the frequency domain on each of the subcarriers to generate eight frequency-separated subcarriers, for example. The optical system 102 can include one laser, e.g., local oscillator, and a set of modulators, e.g., Mach-Zehnder modulators (MZMs), to create all eight digital subcarriers. As illustrated in FIG. 1A, the optical system 102 is operable to generate eight digital subcarriers 120. However, this is merely an example, and other numbers of subcarriers can be generated, such as 16 or 32 subcarriers, in some instances. In some implementations, the number of subcarriers can be designed based on the implementer of the system 100. The optical system 102 also modulates the subcarriers to a desired transmit frequency. Then, the optical system 102 can transmit or supply the modulated optical subcarriers 120

(also known as modulated optical signal 120 or modulated optical subcarriers 120) over transmission channel 104 to the intermediary system 106.

In some implementations, the transmission channel 104 is an optical fiber in an optical communication system. In other implementations, the transmission channel 104 can be air, a coaxial cable, or another medium. The transmission channel 104 may introduce impairments, errors, and delays on the optical subcarriers 120. In some implementations, each leaf system 116 can take one or more steps to remove impairments, errors, and delays during pre- and post-demodulation.

In some implementations, the intermediary system 106 includes one or more components that can power split a received signal and transmit the power split received signal to one or more leaf systems. Additionally, the intermediary system 106 can include one or more components that can spectrally combine, e.g., digitally multiplex, a received signal with other received signals and transmit the spectrally combined signal to the optical system 102. The one or more components that spectrally combine a received signal are described in connection with FIG. 1B. Thus, in some cases, the intermediary system 106 can include a receiver, a transmitter, an optical splitter, and an optical combiner. In some example, the intermediary system 106 can include multiple receivers, multiple transmitters, multiple optical splitters, and multiple optical combiners. For example, the intermediary system can include an optical splitter, an optical de-multiplexer, a combiner, a multiplexer, an arrayed waveguide grating, one or more optical filters, a transceiver system, and one or more optical couplers.

The optical splitter in the intermediary system 106 can receive an optical light beam, e.g., optical subcarriers 120, from optical system 102 over transmission channel 104 and splits the optical light beam into multiple light beams, one light beam for each branch. For example, as illustrated in system 100, the intermediary system 106 splits the optical subcarriers 120 into eight copies of the optical subcarriers 120 for separate branches, one branch for each leaf system since each leaf system will process a separate subcarrier from its respective copy of optical subcarriers 120. In some implementations, each light beam signal can include approximately equal power.

Thus, as shown in system 100, the intermediary system 106 outputs one optical light beam 108 to leaf system 114, another optical light beam 110 to leaf system 116, another optical light beam 112 to leaf system 118, and so on. Each optical light beam, e.g., optical light beams 108, 110, and 112, include the same set of optical subcarriers 120. For example, optical light beam 112 includes optical subcarriers 122, which includes the same optical subcarriers from optical subcarriers 120. The intermediary system 106 transmits the optical light beams 108, 110, and 112 over transmission channels 105, 107, and 109, respectively. Each of the transmission channels 105, 107, and 109 may be of the same type as or a different type from the transmission channel 104. In some implementations, the transmission channels 104, 105, 107, and 109 are bi-directional so that communications can occur downstream and upstream simultaneously.

In some implementations, a system can include N leaf systems where N is a positive whole number. As described with respect to system 100, the system 100 can include, for example, eight leaf systems. Each leaf system is coupled to the intermediary system 106. As is further described below, a leaf system, such as leaf system 114, can receive the optical light beam 108 over transmission channel 105.

Additionally, each leaf system can transmit data to the intermediary system 106. Thus, each leaf system includes a transceiver system to receive and communicate data with the optical system 102 through the intermediary system 106. In addition, because the optical system 102 includes similar components to the leaf systems, the optical system 102 also includes a transceiver system to receive and transmits data with the intermediary system 106 to each of the leaf systems.

Figure 1B:
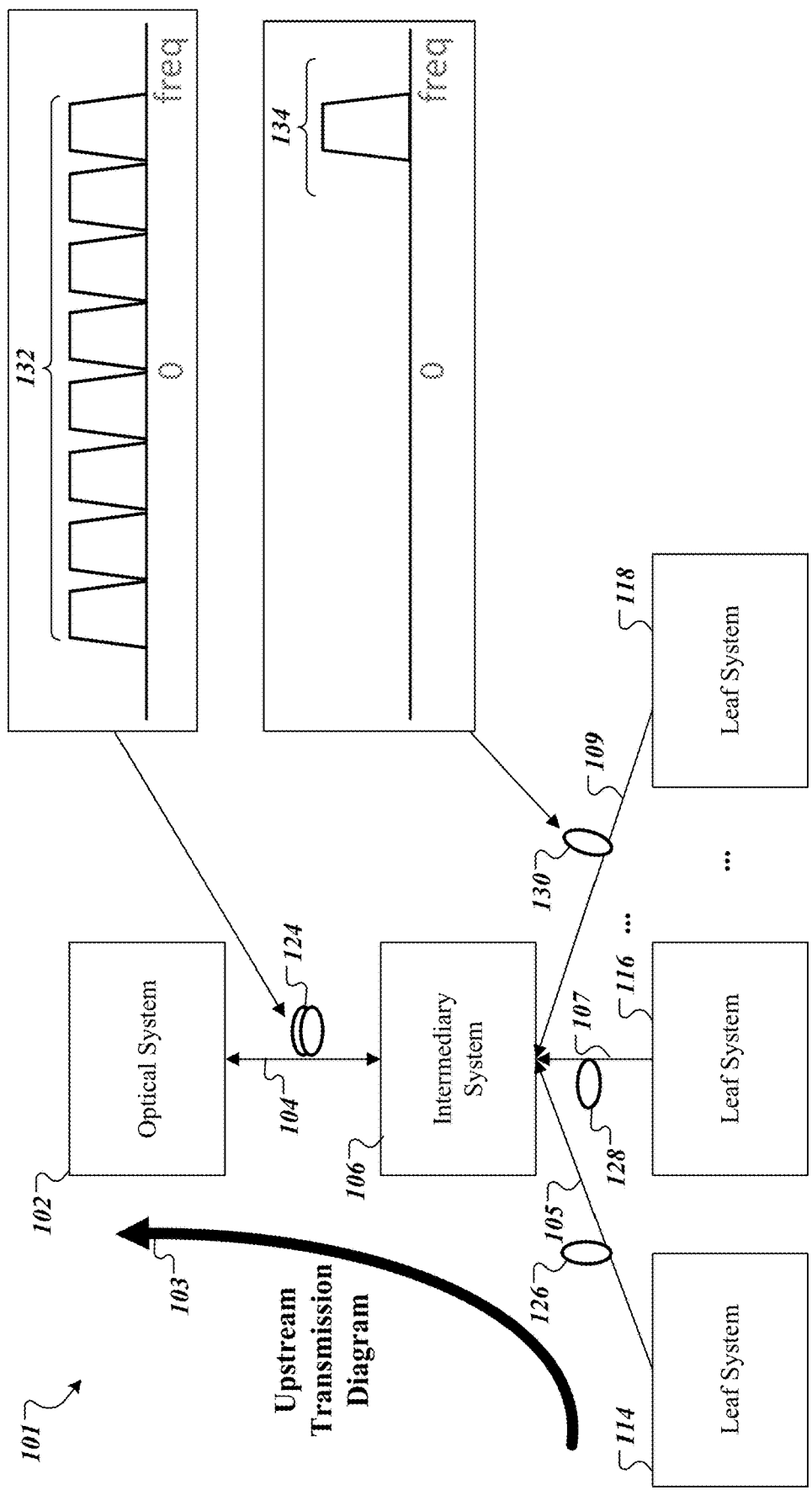
FIG. 1B is a block diagram that illustrates an example of a system for transmitting data up-stream from multiple leaf systems to an optical system.

FIG. 1B is a block diagram that illustrates an example of a system 101 for transmitting data up-stream from multiple leaf systems to an optical system. System 101 can be similar to system 100. In some implementations, the systems 100 and 101 can be integrated into a single system for bi-directional communication. Similar components between the two systems will not be described again in detail. The system 101 illustrates the optical system 102 receiving aggregate data streams in an upstream transmission 103.

As discussed with respect to system 100, each of the leaf systems 114, 116, and 118 is frequency-locked to an incoming subcarrier from the optical system 102 due to a first portion and second portion of light output being provided by the splitter that receives light from a laser. In system 101, it is assumed for the purposes of discussion that the leaf systems 114, 116, and 118 remain frequency locked. In this example regarding the first and second portions of the light, since the laser in the leaf system can be frequency-locked to an incoming subcarrier, and since the laser outputs light corresponding to a particular transmitted subcarrier, the transmitted subcarrier from the leaf system may be the same frequency as the incoming subcarrier from the optical system 102. Each of the leaf systems, e.g., eight leaf systems, may carry out the frequency locking operation so that the eight subcarriers transmitted by each leaf system are appropriately frequency-separated. In addition, each leaf system performs the frequency locking operation so that each of the eight transmitted subcarriers do not interfere or overlap with one another because each transmitted subcarrier of the eight transmitted subcarriers has a respective transmitted frequency corresponding to a respective subcarrier frequency transmitted by the optical system 102.

As illustrated in system 101, each of the leaf systems 114, 116, and 118 transmits a single respective subcarrier to the intermediary system 106. In particular, leaf system 114 transmits a single subcarrier 126 to the intermediary system 106 over transmission channel 105. Likewise, leaf system 116 transmits a single subcarrier 128 to the intermediary system 106 over transmission channel 107, and leaf system 118 transmits a single subcarrier 130 to the intermediary system 106 over transmission channel 109. The single subcarrier 130 corresponds to subcarrier 134 at the far end of the positive spectrum in the frequency domain, as illustrated in system 101. In some implementations, each subcarrier provided by the leaf system can include different data and be transmitted at a different frequency.

The single subcarriers 126, 128, and 130 are transmitted to the intermediary system 106 at the clock frequencies in which they were transmitted by the optical system 102. As such, each of the single subcarriers 126, 128, and 130 will not spectrally overlap one another in the frequency domain during multiplexing because the optical system will have transmitted each of these subcarriers at different center frequencies.

The subcarriers can be spectrally close to one another to increase transmission capacity and maximize economic benefits of the overall system. For example, transmitting multiple data sets together rather than asynchronously can help reduce the amount of bandwidth utilized by system 101.

However, each leaf system transmits a single subcarrier to the intermediary system 106 based on a respective clock frequency associated with that particular leaf system. Accordingly, each respective clock frequency of a particular leaf system may differ by varying frequency amounts. For example, the frequencies may vary by 10 parts per million (ppm) for a period of time, such as seconds or minutes. Accordingly, in some cases, in order for the optical system 102 to properly frequency-lock with each of the received subcarriers, the coherent DSP module within the optical system 102 requires eight separate clock recovery modules, which may increase cost of the DSP and result in higher power consumption of the coherent DSP module.

The intermediary system 106 receives the single subcarriers 126, 128, and 130 from each of the leaf systems 114, 116, and 118, respectively. The intermediary system 106 in the illustrated example includes an optical multiplexer to digital multiplex each of the received single subcarriers. For example, the optical multiplexer may include an arrayed waveguide grating (AWG) or some other multiplexing device. In some implementations, the optical multiplexer may combine multiple output optical signals, received from each of the leaf systems, into a single optical signal, e.g., a WDM signal. In some implementations, the optical multiplexer may combine multiple output optical signals, e.g., the received single subcarriers, in such a way as to produce a polarization diverse signal. A corresponding waveguide may output the WDM signal on an optical fiber, such as transmission channel 104. Each WDM signal may include one or more optical signals, such that each optical signal includes one or more or more wavelengths. In some implementations, one WDM signal may have a first polarization, e.g., a transverse magnetic (TM) polarization, and another WDM signal may have a second, substantially orthogonal polarization, e.g., a transverse electric (TE) polarization. Alternatively, both WDM signals may have the same polarization.

The intermediary system 106 in FIG. 1B receives the single subcarriers 126, 128, and 130 and generates an optical output signal 124 to provide to the optical system 102. The optical output signal 124 includes multiple subcarriers 132, where each subcarrier in the multiple subcarriers 132 was provided by a corresponding leaf system. The intermediary system 106 provides the optical output signal 124 to the optical system 102 over the transmission channel 104.

In some implementations, the optical system 102 and the leaf systems should be clock synchronous (i.e., synchronized to the same clock for the optical system 102) to demodulate the subcarriers properly. For example, each of the leaf systems may have the same clock frequency, which may be derived from the input signal supplied to each leaf engine. Consequently, since the input signal is transmitted from the optical system 102, the transmitted subcarriers 124 from the intermediary system 106 to the optical system 102 will have the same clock frequency. Thus, if each leaf system transmits using the clock frequency of the received subcarrier from the optical system 102, the optical system 102 and each of the leaf systems may be clock synchronous or synchronized to the same clock frequency.

Figure 2:
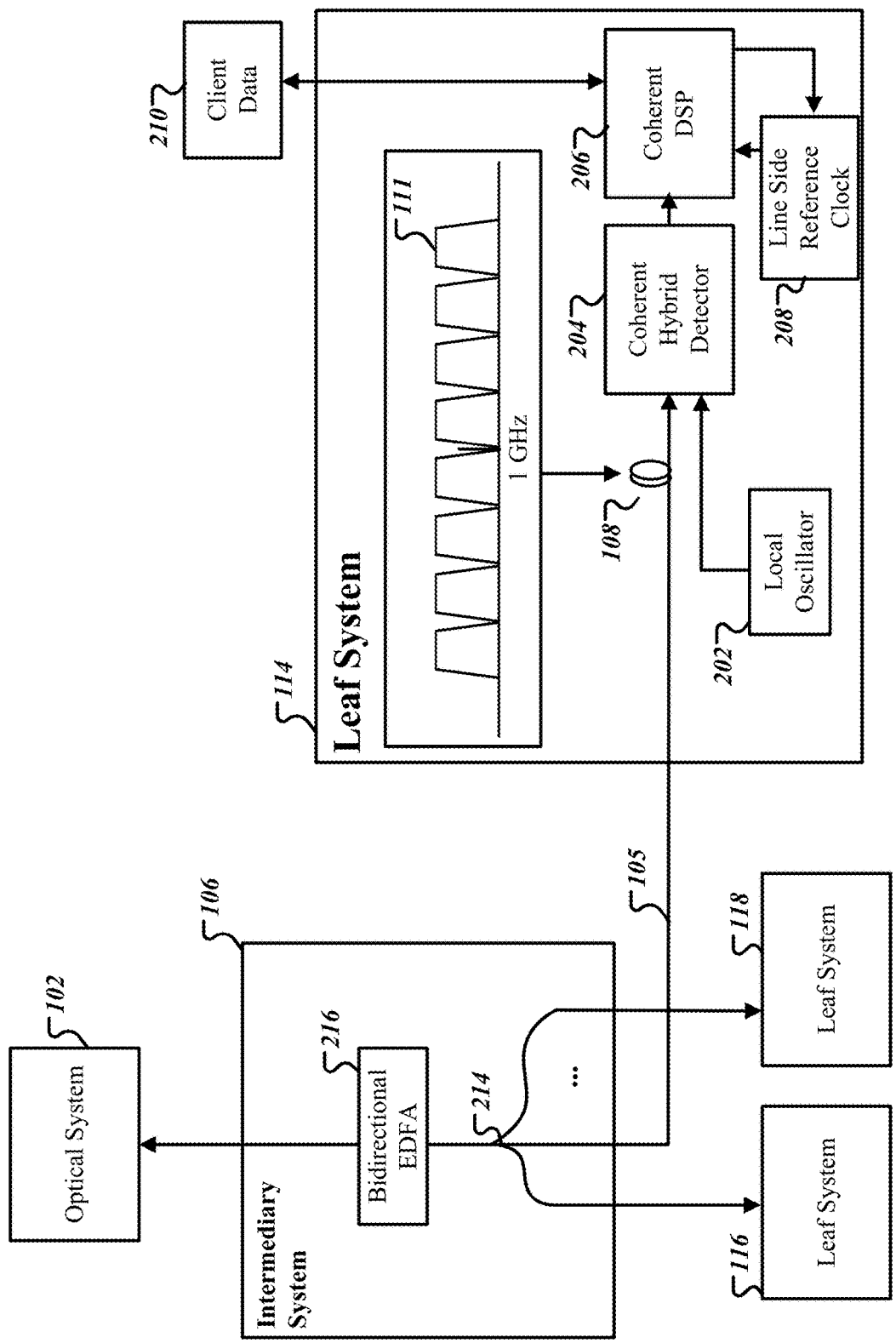
FIG. 2 is a block diagram that illustrates an example of a leaf system and an intermediary system.

FIG. 2 is a block diagram that illustrates an example of a leaf system 114 and an intermediary system 106. FIG. 2 additionally illustrates the optical system 102 and leaf systems 116 and 118. The leaf system 114 is operable to receive input optical signals including subcarriers 108 over transmission channel 105, as illustrated in FIG. 1A. Additionally, the leaf system 114 includes a local oscillator (LO) 202, a coherent hybrid detector 204 (also known as detector circuit 204 or optical hybrid circuit 204), a coherent DSP 206, and a line side reference clock 208 (also known as a reference clock circuit). Additionally, the leaf system 114 communicates with client data 210. Each of the leaf systems 114, 116, and 118, also shown in systems 100 and 101, can include similar components, such as those shown and described with respect to FIGS. 1A and 1B.

In some implementations, the input subcarriers 108 include subcarriers received from the optical system 102 via the intermediary system 106 over transmission channel 105. For example, input subcarriers 108 may include eight subcarriers. In other examples, the input subcarriers 108 can include, e.g., four or sixteen subcarriers.

A leaf system can include a local oscillator (LO) laser that may be tuned to the approximate frequency of one of the subcarrier's to be able to select that subcarrier for demodulation. For example, each leaf system includes a LO laser that can be frequency-locked to the input optical subcarrier from a corresponding received light beam by an active control loop using information in the leaf system's DSP and a laser frequency control port coupled to the laser. The LO laser may be provided, with optical hybrids and photodiodes in a photonic integrated circuit, for example, to form part of an active wave-locking control loop.

Additionally, each leaf system includes a transmitter and a receiver. In some implementations, one laser, e.g., local oscillator, can be shared between the transmitter and the receiver in each leaf system, such that a first portion of light output from the laser is provided to both modulators in transmitter, which in turn, outputs an upstream-modulated optical signal. The modulated optical signal can include a single subcarrier. In addition, a second portion of the light output from the laser is provided to optical hybrids within the leaf system for mixing the second portion of the light with the incoming subcarriers. The first and second portions of the light may be output from a splitter within the leaf system that receives light from one side of the laser, or the first and second portions of the light may be output from first and second sides of the laser, respectively.

Local oscillator 202 may include, for example, one or more lasers. In some implementations, local oscillator 202 may include a laser to provide a local oscillator signal (such as an optical signal) to the coherent hybrid detector 204. For example, the local oscillator 202 selects a particular subcarrier, e.g., subcarrier 111, to demodulate from the input subcarriers 108. For example, in some implementations, the local oscillator 202 tunes to a frequency of 1.05 GHz for the coherent hybrid detector to detect subcarrier 111 from the subcarriers 108 and for the coherent DSP 206 to demodulate that detected subcarrier 111. In some implementations, local oscillator 202 includes a single-sided laser to provide an optical signal to the coherent hybrid detector 204. In some other implementations, local oscillator 202 includes a double-sided laser to provide multiple optical signals to the coherent hybrid detector 204.

Coherent hybrid detector 204 may include a combiner that receives an optical signal, e.g., the input subcarriers 108, and the local oscillator signal from local oscillator 202 and combines the optical signals to generate an optical output signal. For example, the coherent hybrid detector 204 can generate an optical output signal that includes only the detected subcarrier 111 from subcarriers 108. In some implementations, the coherent hybrid detector 204 may split the optical input signal into two, so as to create two orthogonal signals (e.g., by adding the first optical input signal and the optical signal from the local oscillator 202, with zero phase, and by adding the second optical input signal and the optical signal, from the local oscillator 202, with 90 degrees phase), and combine the two orthogonal signals for presentation to a detector within the coherent hybrid detector 204.

The detector within the coherent hybrid detector 204 may include a photodetector, such as a photodiode, to receive the output optical signal from the combiner and convert the output optical signal to corresponding voltage signals. In some implementations, the detector may detect the entire spectrum, e.g., containing all of the subcarriers within the input subcarriers 108.

The coherent DSP 206 may include a transmit DSP, a receive DSP, one or more ADCs, one or more DACs, and one or more voltage controlled oscillators (VCOs). The coherent DSP 206 can receive the voltage signals from the coherent hybrid detector 204 and independently process each of the voltage signals. The functions corresponding components within the coherent DSP 206 is further described below in connection with FIG. 3.

In some implementations, the line side reference clock 208 provides timing for synchronization for components within the coherent DSP 206. Additionally, the line side reference clock 208 can receive frequency adjustments from the coherent DSP 206 and apply the frequency adjustment to the VCOs within the coherent DSP 206 to adjust a sampling rate of ADCs and DACs. This feature is further described below.

The coherent DSP 206 also can communicate with client data 210. The client data 210 can include other components found within, and external to, the leaf system 114. The coherent DSP 206 can provide data processed from the input subcarriers 108 to the client data 212.

The intermediary system 106 includes one or more paths 214 and a bidirectional erbium-doped fiber amplifier (EDFA) 216. The bidirectional EDFA 216 is an optical repeater device that is used to boost the intensity of optical signals being carried through a fiber optic communications network. The intermediary system 106 includes an input optical waveguide, and multiple output waveguides, e.g., the one or more paths 214, with an additional block of waveguide material that optically couples the input waveguide to the output waveguides. The one or more paths 214 couples to the one or more leaf systems, e.g., leaf systems 114, 116, 118, etc., and the opposite end of the bidirectional EDFA 216 couples to the optical system 102.

Figure 3:
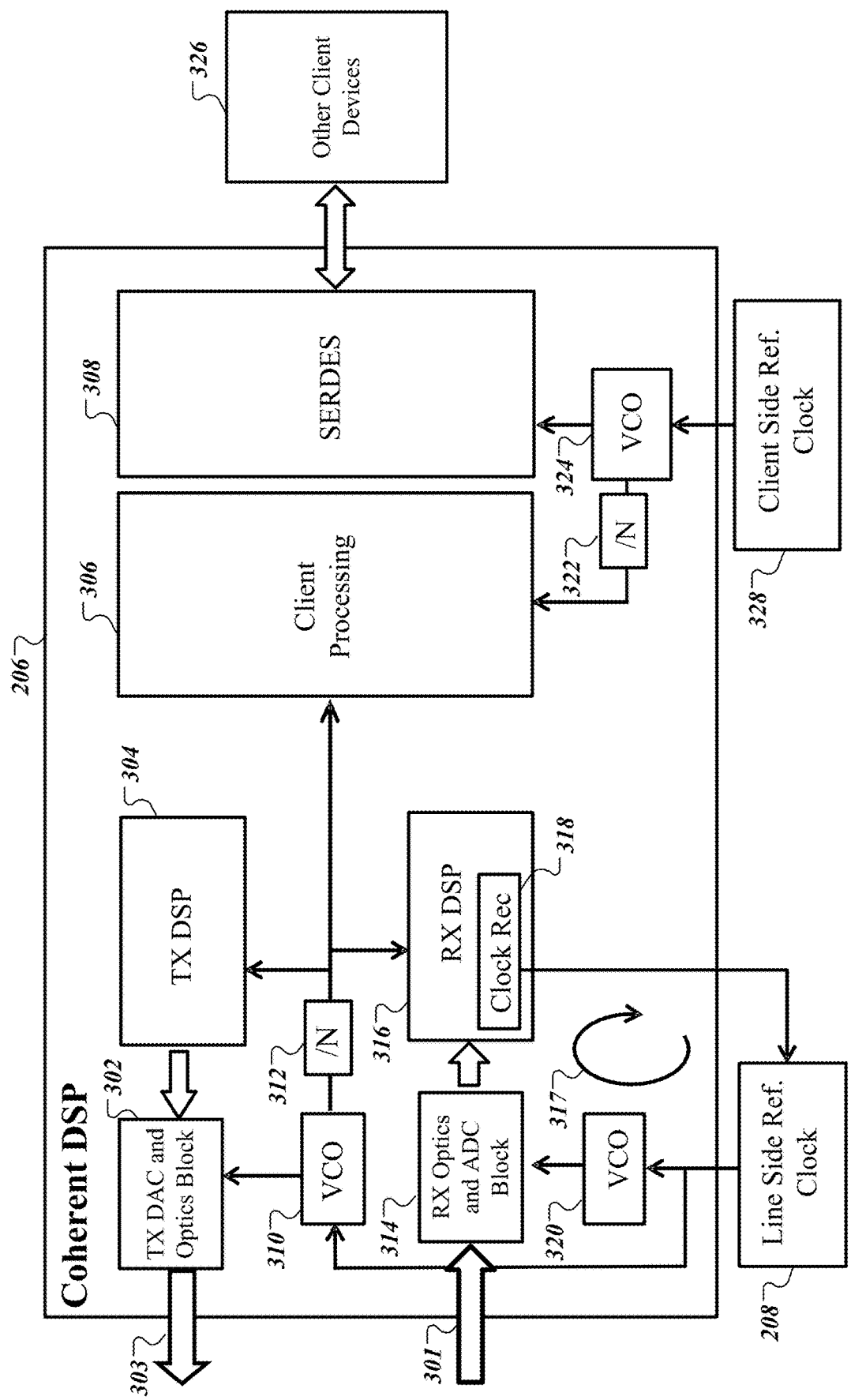
FIG. 3 is a block diagram that illustrates an example of a coherent digital signal processor (DSP) and other components within a leaf system.

FIG. 3 is a block diagram that illustrates an example of a coherent DSP 206 and other components within a leaf system. The components shown in FIG. 2 illustrate components within leaf system 114 from FIGS. 1A, 1B, and 2, for example. Similar components exist within other leaf systems. The leaf system 114 includes a coherent DSP 206, a line side reference clock 208, a client side reference clock 328, and other client devices 326. The coherent DSP 206 includes a transmit (TX) DAC and Optics Block 302, a TX DSP 304, a client processing module 306, a serializer/deserializer (SERDES) 308, a VCO 310, a division module 312, a receive (RX) Optics and ADC Block 314, an RX DSP 316, a clock recovery module 318 within the RX DSP 316, a VCO 320, a division module 322, and a VCO 324.

The TX DAC and Optics Block 302 includes multiple DACs and can receive a sequence of integers or digital values from the TX DSP 304 and, based on the sequence of assigned integers, generate corresponding voltage signals. The coherent DSP 206 can transmit the corresponding voltage signals to the intermediary system 106 over a particular transmission channel. For example, the TX DAC and Optics Block 302 may include four DACs for obtaining the corresponding voltage signals.

The TX DSP 304 also can include a digital signal processor. In particular, the TX DSP 304's digital signal processor can receive input data from a data source, e.g., such as from client data 210 in FIG. 2, and can determine the signal to apply to generate multiple subcarriers. In some implementations, the TX DSP 304 may receive streams of data, map the streams of data into each subcarrier (or subcarriers), independently apply spectral shaping to the subcarrier, and obtain, based on the spectral shaping of each of the subcarriers, a sequence of assigned integers to supply to the TX DAC and Optics Block 302. In some implementations, the TX DSP 304 may generate the subcarriers or subcarrier using time domain filtering and frequency shifting by multiplication in the time domain.

The client processing module 306 is operable to adjust for data rate differences between the components within the coherent DSP 206 and the other client devices 326. In particular, the client processing module 306 performs data alignment and data framing to allow components within the coherent DSP 206 to communicate with the other client devices 326. For example, the TX DSP 304, the RX DSP 316, the TX DAC and Optics Block 302, the RX Optics and ADC Block 314, and the VCOs 310 and 320 may communicate in the 1-10 GHz range, whereas the SERDES 308 and the other client devices 326 may communicate in the 100-500 MHz range. The client processing module 306 can correct for or adjust the data rate differences by bit stuffing and performing pointer adjustments.

The SERDES 308 includes a pair of blocks for performing high-speed communications. In some implementations, the SERDES 308 receives data from the other client devices 326 and data from the client side reference clock 328 and routes data to the components on the coherent DSP 206 at the rate required by the components on the coherent DSP 206. In other implementations, the SERDES 308 transmits data to the other client devices 326 at a data rate defined by the client side reference clock 328. For example, the SERDES 308 serializes data to provide to the other client devices 326 at a data rate of 600 MHz, as provided by the client side reference clock 328.

The VCOs 310, 320, 324 may include a voltage-controlled crystal oscillator and/or some other type of oscillator that functions as clock generator. In particular, each of the VCOs in the coherent DSP 206 may receive a voltage that corresponds to a clock phase adjustment from a line side reference clock 208. In some implementations, the VCO 310 provides a sequence to the DACs in the TX DAC and Optics Block 302, which may identify time instances when the TX DAC and Optics Block 302 is to transmit analog samples to the intermediary system 106 over optical path 303 that forms a subset of transmission channel 105. In some implementations, the VCO 320 provides a sequence to the ADCs in the RX Optics and ADC block 314, which may identify time instances when the RX Optics and ADC block 314 are to provide samples of digital signals to the RX DSP 316. In some implementations, the sequence provided by the VCOs is based on the phase correction determined by the clock recovery module 318, e.g., a voltage value corresponding to a clock phase error.

The division modules 312 and 322 (collectively "division module") are operable to divide out the number of samples output by the VCOs. In some implementations, the division modules divide the number of samples output by the VCOs by a particular number to match the data rates used by components in the coherent DSP 206. For example, the VCO 310 transmits data at 16 GHz. However, the client processing module 306 operates at 500 MHz and thus, cannot properly process data provided at 16 GHz. Thus, the division module 312 includes a factor of 32 to divide the number of samples at 16 GHz to 500 MHz. A similar principle applies for division module 322. Other data rate values are possible for the components within the coherent DSP 206.

The RX Optics and ADC block 314 can include multiple analog-to-digital converters (ADCs) that each converts a voltage signal received over optical communication path 301 from the coherent hybrid detector 204 to digital samples. The RX Optics and ADC block 314 may provide the digital samples to RX DSP 316 at a rate indicated by the VCO 320. For example, the RX Optics and ADC Block 314 may include four ADCs.

The RX DSP 316 can receive the digital samples from the RX Optics and ADC Block 314, de-multiplex the samples according to the received subcarriers, independently process the samples for each of the subcarriers or a single subcarrier, map the processed samples to produce output data, and output the output data.

The RX DSP 316 includes a clock recovery module 318. In some implementations, the clock recovery module 318 analyzes the received samples provided by the RX Optics and ADC block 314 and generates a voltage that corresponds to a clock phase error, to be provided to the line side reference clock 208. The voltage generated by the clock recovery module 318 is used to reduce timing errors associated with the RX Optics and ADC Block 314 sampling of the analog subcarriers. For example, the VCO 320 may be tuned to instruct the ADCs in the RX Optics and ADC Block 314 to sample a subcarrier signal thought to have a data rate of 100 GHz, when in fact, the subcarrier signal was transmitted at 100.001 GHz. The 0.001 GHz difference between the actual transmission rate and the predetermined transmission rate can cause errors in the RX DSP 316's demodulation of the subcarrier. Thus, the clock recovery module 318 can generate the clock phase error and transmit the clock phase error to the line side reference clock 208 for reducing the clock phase errors.

The line side reference clock 208 is operable to receive the clock phase error from the clock recovery module 318 and to adjust the value of its output clock rate provided to VCOs 310 and 320. In particular, the line side reference clock 208 receives the voltage indicating the clock phase error from the clock recovery module 318 and adjusts the output clock rate provided to the VCOs 310 and 320. For example, the line side reference clock 208 may initially provide a sequence at a clock rate of 2 GHz to the VCOs 310 and 320. The VCOs receives the sequence and in response, generates a toggle sequence at a rate of 16 GHz to provide to the DACs in the TX DAC and Optics Block 302 and the ADCs in the RX Optics and ADC Block 314. Thus, a ratio of 1:8 exists between the line side reference clock 208 and the VCOs. At a later point in time, the line side reference clock 208 receives a clock phase error from the clock recovery module 318 and generates a new sequence at a clock rate of 2.01 GHz to provide to the VCOs 310 and 320. The VCOs receives the sequence, and in response, generates a second toggle sequence at a rate of 16.08 to provide to the DACs and the ADCs. The ratio of 1:8 is still maintained between the line side reference clock 208 and the VCOs. In some examples, the ratio can be other values, e.g., 1:8.1, 1:7.99, etc., between the line side reference clock and the VCOs. By changing the toggle sequence at the VCOs, and in particular, the VCO 320, the ADCs in the RX Optics and ADC Block 314 can sample the incoming subcarrier signals properly such that the clock phase error is minimized.

Preferably, the clock phase error converges towards zero at the RX DSP 316 as the clock recovery module 318 detects smaller and smaller clock phase errors. The line side reference clock 208 and VCO 320 can continuously adjust the sampling rate of the ADCs each time the clock recovery module 208 detects a clock phase error in the sampled subcarriers. Thus, the coherent DSP 206 operates in a clock recovery loop, shown in 317. The coherent DSP 206 seeks to minimize the clock phase error introduced by the sampling rate at the ADCs. Once the clock phase error has been minimized to zero, or minimized below a threshold value, the coherent DSP 206 is noted to be "frequency locked" to the data rate of the respective subcarrier transmitted by the optical system 102. When the coherent DSP 206 is frequency locked, the line side reference clock 208 is clock synchronous or synchronized to the line side reference clock at the optical system 102. In other implementations, the coherent DSP 206 may utilize a fractional synthesizer module instead of a line side reference clock 208. The fractional synthesizer module includes a digital tuning port allowing for digitally tuning the VCOs 320 and 310. The fractional synthesizer module would be placed within the coherent DSP 206 near the VCO 320.

Once the line side reference clock 208 in the leaf system 114 is frequency-locked to the line side reference clock at the optical system 102, the coherent DSP 206 can transmit a subcarrier out of the TX DAC and Optics Block 302 at the locked frequency rate. In some implementations, the line side reference clock 208 provides the locked frequency rate to the VCO 310. The VCO 310 receives the locked frequency rate and based on the locked frequency rate, generates a sequence to provide to the TX DAC and Optics Block 302. The sequence provided to the TX DAC and Optics Block 302 causes the DACs to transmit the analog samples to the intermediary system 106 at the rate specified in the sequence.

Thus, the coherent DSP 206 in each leaf system performs the clock recovery loop on a respective subcarrier that it received. Each of the leaf systems then is synchronized with the transmit data rates of the subcarriers from the optical system 102. Each leaf system receives a subcarrier at a data rate indicated by the optical system 102, and each leaf system transmits data, e.g., another subcarrier, back to the optical system 102 through the intermediary system 106 at the same data rate. This can be advantageous because each leaf system's VCOs and line side reference clock is synchronized to the line side reference clock at the optical system 102 enabling minimal complexity at the optical system 102's receiver. Further, when the coherent DSP 206 transmits data, e.g., a subcarrier, to the intermediary system 106, the coherent DSP 206 transmits data at the clock frequency rate designated by the optical system, which ensures each subcarrier does not collide or spectrally overlap with one another.

In some implementations, the client side reference clock 328 is similar to line side reference clock 208. However, the client side reference clock 328 can be a free-running clock that is not synchronized to the clock frequency of the optical system 102. Rather, the client side reference clock 328 provides a clocking sequence to the VCO 324 such that the SERDES 308 is communicating with the other client devices 326 at their desired data rates. The other client devices 326 can include other chipsets and circuitry components onboard the leaf system.

Figure 4:
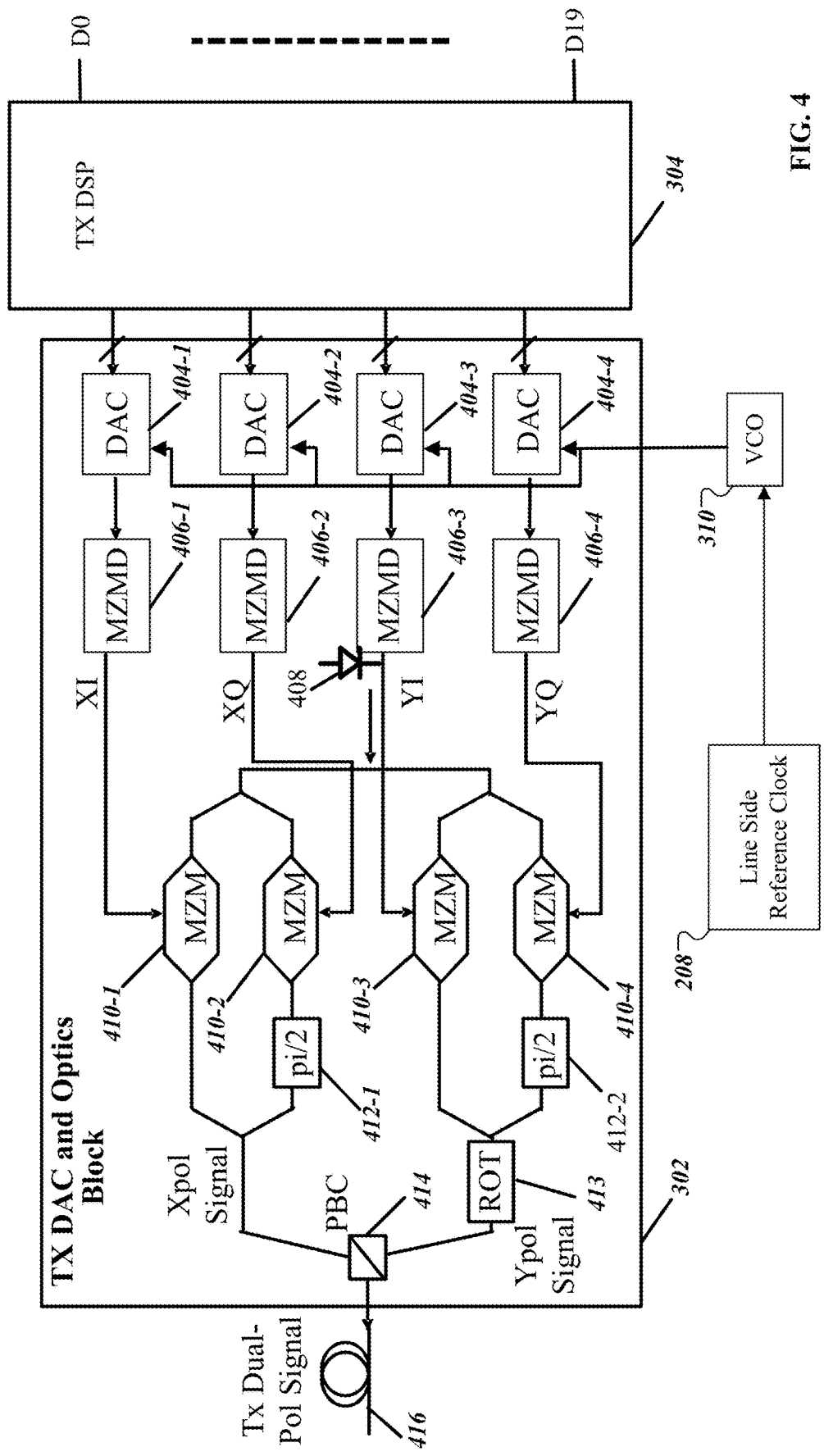
FIG. 4 is a block diagram that illustrates an example of a digital-to-analog converter (DAC)and a transmit DSP.

FIG. 4 illustrates an example of a transmitter consistent with the present disclosure. FIG. 4 includes similar components to those shown and described in FIG. 3. The transmitter may include a TX DSP 304, which, in this example, receives multiple data inputs D0-D19. TX DSP 304, however, may receive more or fewer data inputs. Based on data inputs D0-D19, the TX DSP 304 can supply multiple outputs to DACs 404-1 to 404-4, which convert digital signals received from the TX DSP 304 into corresponding analog signals. The DACs 404-1 to 404-4 include the sequence signal from the VCO 310, which receives a signal from the line side reference clock 208, as described with respect to FIG. 3. TX DAC and optics block 302 may also include driver circuits 406-1 to 406-2 that receive the analog signals from DACs 404-1 to 404-4 and adjust the voltages or other characteristics of the received analog signals to provide drive signals to a corresponding one of modulators 410-1 to 410-4.

In the illustrated example, each of the modulators 410-1 to 410-4 can be, for example, a Mach-Zehnder modulator (MZM) that modulates the phase and/or amplitude of the light output from laser 408, which also can be included in block 302. As further shown in FIG. 4, light output from laser 408 is split, such that a first portion of the light is supplied to a first MZM pairing including MZMs 410-1 and 410-2, and a second portion of the light is supplied to a second MZM pairing including MZMs 410-3 and 410-4. The first portion of the light is further split into third and fourth portions, such that the third portion is modulated by MZM 410-1 to provide an in-phase (I) component of an X (or TE) polarization component of a modulated optical signal, and the fourth portion is modulated by MZM 410-2 and fed to phase shifter 412-1 to shift the phase of such light by 90 degrees in order to provide a quadrature (Q) component of the X polarization component of the modulated optical signal. Similarly, the second portion of the light is further split into fifth and sixth portions, such that the fifth portion is modulated by MZM 410-3 to provide an I component of a Y (or TM) polarization component of the modulated optical signal, and the sixth portion is modulated by MZM 410-4 and fed to phase shifter 412-2 to shift the phase of such light by 90 degrees to provide a Q component of the Y polarization component of the modulated optical signal.

The optical outputs of MZMs 410-1 and 410-2 are combined to provide an X polarized optical signal including I and Q components and fed to a polarization beam combiner (PBC) 414. In addition, the outputs of MZMs 410-3 and 410-4 are combined to provide an optical signal that is fed to polarization rotator (ROT) 413 that rotates the polarization of such optical signal to provide a modulated optical signal having a Y (or TM) polarization. The Y polarized modulated optical signal is also provided to PBC 414, which combines the X and Y polarized modulated optical signals to provide a polarization multiplexed ("dual-pol") modulated optical signal onto optical fiber 416, for example, which may be included as a segment of optical fiber in optical communication path 105. Based on the outputs of MZMDs 410-1 to 410-4, a plurality of optical subcarriers SC0 to SC19 may be output onto optical fiber 416, which is coupled to the optical system 102 through the intermediary system 106.

The polarization multiplexed optical signal output from TX DAC and optics block 302 includes subcarriers SC0-SC19, for example, such that each subcarrier has X and Y polarization components and I and Q components.

Figure 5:
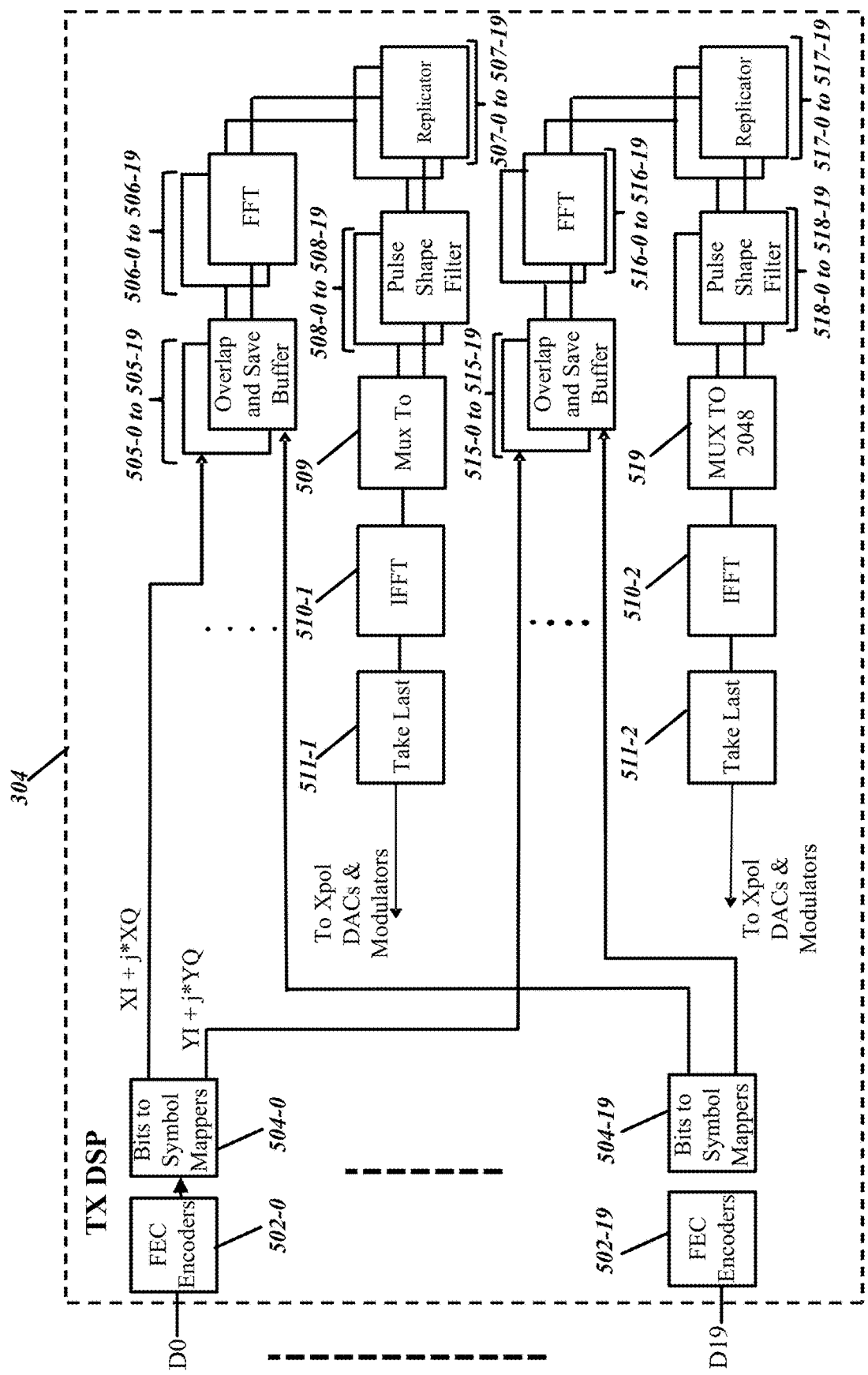
FIG. 5 is a block diagram that illustrates an example of a transmit (TX) DSP.

FIG. 5 is a block diagram that illustrates an example of a transmit (TX) DSP 304. In particular, FIG. 5 illustrates a TX DSP 304 from FIGS. 3 and 4. TX DSP 304 may include FEC encoders 502-0 to 502-19, each of which may receive a respective one of multiple data inputs D0 to D19. FEC encoders 502-0 to 502-19 carry out forward error correction (FEC) coding on a corresponding one of the switch outputs, such as, by adding parity bits to the received data. FEC encoders 502-0 to 502-19 also may provide timing skew between the subcarriers to correct for skew introduced during transmission over one or more optical fibers. In addition, FEC encoders 502-0 to 502-19 may interleave the received data.

Each of FEC encoders 502-0 to 502-19 provides an output to a corresponding one of multiple bits-to-symbol circuits, 504-0 to 504-19 (collectively referred to herein as "504"). Each of the bits-to-symbol circuits 504 can map the encoded bits to symbols on a complex plane. For example, bits-to-symbol circuits 504 may map four bits to a symbol in a dual-polarization QPSK constellation. Each of the bits-to-symbol circuits 504 provides first symbols, having the complex representation XI+j*XQ, associated with a respective one of the data input, such as D0, to overlap and save buffer 505. Data indicative of such first symbols may be carried by the X polarization component of each subcarrier SC0-SC19.

Each of the bits-to-symbol circuits 504 may further provide second symbols having the complex representation YI+j*YQ, also associated with a corresponding one of data inputs D0 to D19. Data indicative of such second symbols, however, is carried by the Y polarization component of each of subcarriers SC-0 to SC-19.

As further shown in FIG. 5, each of the first symbols output from each of the bits-to-symbol circuits 504 is supplied to a respective one of first overlap and save buffers 505-0 to 505-19 (collectively referred to herein as overlap and save buffers 505) that can buffer 256 symbols, for example. Each of the overlap and save buffers 505 may receive 128 of the first symbols or another number of such symbols at a time from a corresponding one of the bits-to-symbol circuits 504. Thus, overlap and save buffers 505 may combine 128 new symbols from bits-to-symbol circuits 504, with the previous 128 symbols received from the bits-to-symbol circuits 504.

Each overlap and save buffer 505 supplies an output, which is in the time domain, to a corresponding one of fast Fourier Transform (FFT) circuits 506-0 to 506-19 (collectively referred to as "FFTs 506"). In one example, the output includes 256 symbols or another number of symbols. Each of FFTs 506 converts the received symbols to the frequency domain using or based on, for example, a fast Fourier transform. Each of FFTs 506 may include 256 memories or registers, also referred to as frequency bins or points that store frequency components associated with the input symbols. Each of replicator components 507-0 to 507-19 ma replicate the 256 frequency components associated with of FFTs 506 and store such components in 512 frequency bins or another number of frequency bins (e.g., for T/2 based filtering of the subcarrier) in a respective one of the plurality of replicator components. Such replication may increase the sample rate. In addition, replicator components or circuits 507-0 to 507-19 may arrange or align the contents of the frequency bins to fall within the bandwidths associated with pulse shaped filter circuits 508-0 to 508-19.

Each of pulse shaped filter circuits 508-0 to 508-19 may apply a pulse shaping filter to the data stored in the 512 frequency bins of a respective one of the plurality of replicator components 507-0 to 507-19 to thereby provide a respective one of a plurality of filtered outputs, which are multiplexed and subject to an inverse FFT, as described below. Pulse shape filter circuits 508-1 to 508-19 calculate the transitions between the symbols and the desired subcarrier spectrum so that the subcarriers can be spectrally packed together for transmission, e.g., with a close frequency separation. Pulse shaped filter circuits 508-0 to 508-19 may also be used to introduce timing skew between the subcarriers to correct for timing skew induced by links between nodes shown in FIG. 1, for example. Multiplexer component 509, which may include a multiplexer circuit or memory, may receive the filtered outputs from pulse shaped filter circuits 508-0 to 508-19, and multiplex or combine such outputs together to form an element vector.

Next, IFFT circuit or component 510-1 may receive the element vector and provide a corresponding time domain signal or data based on an inverse fast Fourier transform (IFFT). In one example, the time domain signal may have a rate of 64 gigasamples per second (GSample/s). Take last buffer or memory circuit 511-1 may select the last 1024 or another number of samples from an output of IFFT component or circuit 510-1 and supply the samples to DACs 404-1 and 404-2 at 64 GSample/s, for example. As noted above, DAC 404-1 is associated with the in-phase (I) component of the X pol signal and DAC 404-2 is associated with the quadrature (Q) component of the Y pol signal. Accordingly, consistent with the complex representation XI+jXQ, DAC 404-1 receives values associated with XI and DAC 404-2 receives values associated with jXQ. Based on these inputs, DACs 404-1 and 404-2 provide analog outputs to MZMD 406-1 and MZMD 406-2, respectively, as discussed above.

As further shown in FIG. 5, each of the bits-to-symbol circuits 504-0 to 504-19 outputs a corresponding one of symbols indicative of data carried by the Y polarization component of the polarization multiplexed modulated optical signal output on optical fiber 416. As further noted above, these symbols may have the complex representation YI+j*YQ. Each such symbol may be processed by a respective one of overlap and save buffers 515-0 to 515-19, a respective one of FFT circuits 516-0 to 516-19, a respective one of replicator components or circuits 517-0 to 517-19, pulse shape filter circuits 518-0 to 518-19, multiplexer or memory 519, IFFT 510-2, and take last buffer or memory circuit 511-2, to provide processed symbols having the representation YI+j*YQ in a manner similar to or the same as that discussed above in generating processed symbols XI+j*XQ output from take last circuit 511-1. In addition, symbol components YI and YQ are provided to DACs 404-3 and 404-4, respectively. Based on these inputs, DACs 404-3 and 404-4 provide analog outputs to MZMD 406-3 and MZMD 406-4, respectively, as discussed above.

While FIG. 5 shows TX DSP 304 as including a particular quantity and arrangement of functional components, in some implementations, TX DSP 304 may include additional functional components, fewer functional components, different functional components, or differently arranged functional components. In addition, typically the number of overlap and save buffers, FFTs, replicator circuits, and pulse shape filters associated with the X component may be equal to the number of data inputs, and the number of such circuits associated with the Y component may also be equal to the number of switch outputs. However, in other examples, the number of data inputs may be different from the number of these circuits.

As noted above, based on the outputs of MZMDs 406-1 to 406-4, multiple optical subcarriers SC0 to SC19 may be output onto optical fiber 416.

A receiver optics and analog-to-digital (A/D) converter is described next with reference to FIG. 6.

Figure 6:
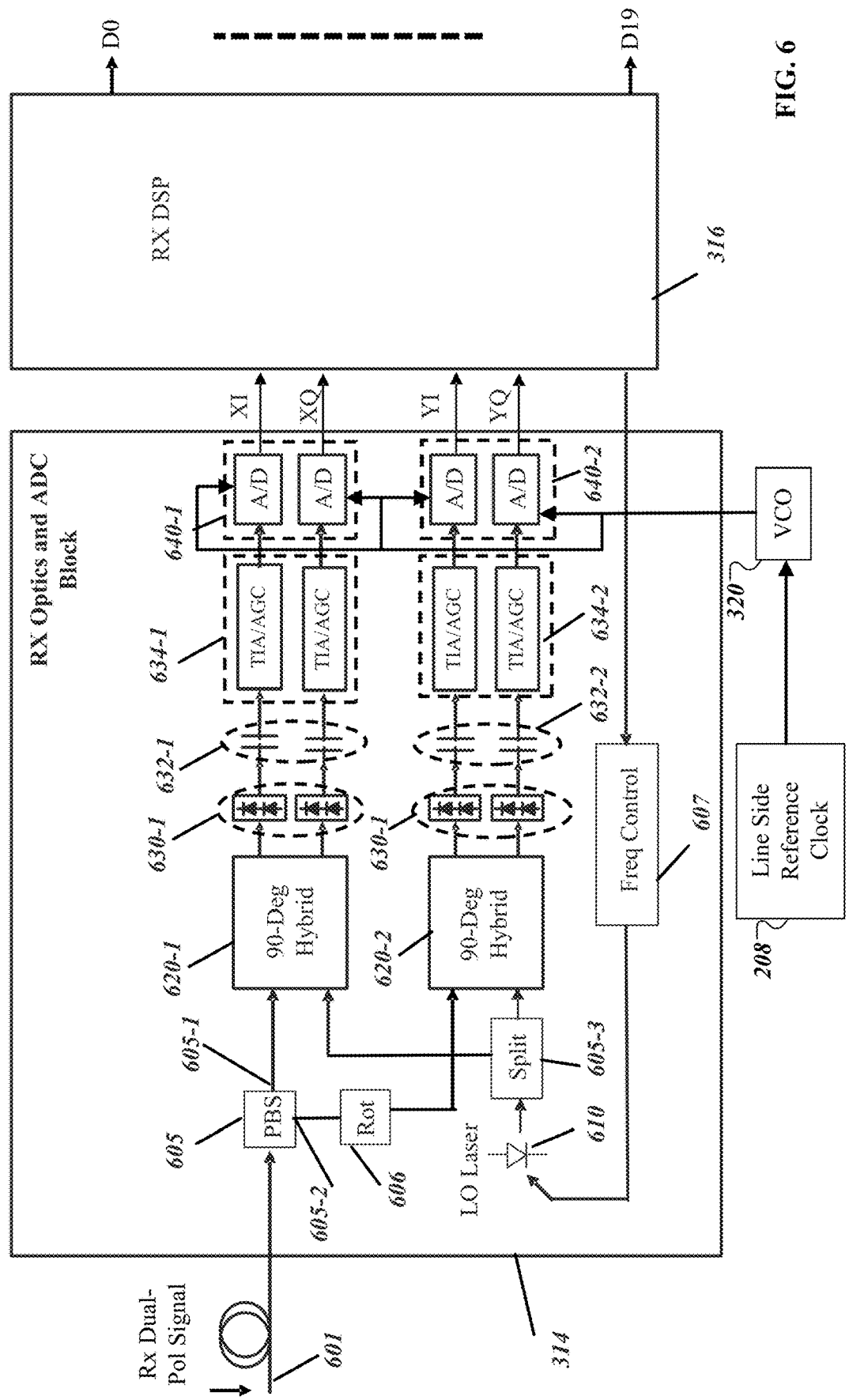
FIG. 6 is a block diagram that illustrates an example of an analog-to-digital converter (ADC) and a receive DSP.

As shown in FIG. 6, optical receiver may include an RX optics and ADC Block 314 and an RX DSP 316, which may collectively carry out coherent detection. FIG. 6 includes similar components shown in FIG. 3. RX Optics and ADC Block 314 may include a polarization beam splitter (PBS) 605 with first (605-1) and second (605-2) outputs, a local oscillator (LO) laser 610, 90 degree optical hybrids or mixers 620-1 and 620-2 (referred to generally as hybrid mixers 620 and individually as hybrid mixer 620), and detectors 630-1 and 630-2 (referred to generally as detectors 630 and individually as detector 630, each including either a single photodiode, photodiode circuit, or balanced photodiode). Additionally, block 314 includes alternating current (AC) coupling capacitors 632-1 and 632-2, trans-impedance amplifiers/automatic gain control circuits (TIA)/(AGC) 634-1 and 634-2, ADCs 640-1 and 640-2 (referred to generally as ADCs 640 and individually as ADC 640), and an RX DSP 316. The ADCs 640-1 and 640-2 receive a sequence signal from VCO 320 that indicates a particular sampling rate for each of the ADCs 640. The line side reference clock 208 provides a signal to the VCO 320 for instructing each of the ADCs 640, as described with respect to FIG. 3.

Polarization beam splitter (PBS) 605 may include a polarization splitter that receives an input polarization multiplexed optical signal including optical subcarriers SC0 to SC19 supplied by optical fiber link 601, which may be, for example, an optical fiber segment as part of one of optical communication path 301 noted above. PBS 605 may split the incoming optical signal into the two X and Y orthogonal polarization components. The Y component may be supplied to a polarization rotator 606 that rotates the polarization of the Y component to have the X polarization. Hybrid mixers 620 may combine the X and rotated Y polarization components with light from local oscillator laser 610. For example, hybrid mixer 620-1 may combine a first polarization signal (e.g., the component of the incoming optical signal having a first or X (TE) polarization output from PBS port 605-1) with light from local oscillator 610, and hybrid mixer 620-2 may combine the rotated polarization signal (e.g., the component of the incoming optical signal having a second or Y (TM) polarization output from PBS port 605-2) with the light from local oscillator 1110. In one example, polarization rotator 606 may be provided at PBS output 605-2 to rotate Y component polarization to have the X polarization.

Detectors 630 may detect mixing products output from the optical hybrids, to form corresponding voltage signals, which are subject to AC coupling by capacitors 632-1 and 632-1, as well as by TIA/AGCs 634-1 and 634-2. The outputs of TIA/AGCs 634-1 and 634-2 and ADCs 640 may convert the voltage signals to digital samples. For example, two detectors or photodiodes 630-1 may detect the X polarization signals to form the corresponding voltage signals, and a corresponding two ADCs 640-1 may convert the voltage signals to digital samples for the first polarization signals after amplification, gain control and AC coupling. Similarly, two detectors 630-2 may detect the rotated Y polarization signals to form the corresponding voltage signals, and a corresponding two ADCs 640-2 may convert the voltage signals to digital samples for the second polarization signals after amplification, gain control and AC coupling. RX DSP 316 may process the digital samples associated with the X and Y polarization components to output data D0 to D19 associated with subcarriers SC0 to SC19.

While FIG. 6 shows the optical receiver, e.g., RX optics and ADC Block 314 and RX DSP 316, as including a particular quantity and arrangement of components, in some implementations, the optical receiver may include additional components, fewer components, different components, or differently arranged components. The number of detectors 630 and/or ADCs 640 may be selected to implement an optical receiver that is capable of receiving a polarization multiplexed signal. In some instances, one of the components illustrated in FIG. 6 may carry out a function described herein as being carried out by another one of the components illustrated in FIG. 6.

Consistent with the present disclosure, in order to demodulate subcarriers SC0 to SC19, local oscillator 610 may be tuned to output light having a wavelength or frequency relatively close to one or more of the subcarrier wavelengths or frequencies to thereby cause a beating between the local oscillator light and the subcarriers.

In some examples, the local oscillator is a semiconductor laser, which may be tuned thermally or through current adjustment. If thermally tuned, the temperature of the local oscillator laser 610 is controlled with a thin film heater, for example, provided adjacent the local oscillator laser. Alternatively, the current supplied to the laser may be controlled, if the local oscillator laser is current-tuned. The local oscillator laser 610 may be a semiconductor laser, such as a distributed feedback laser or a distributed Bragg reflector laser.

Figure 7:
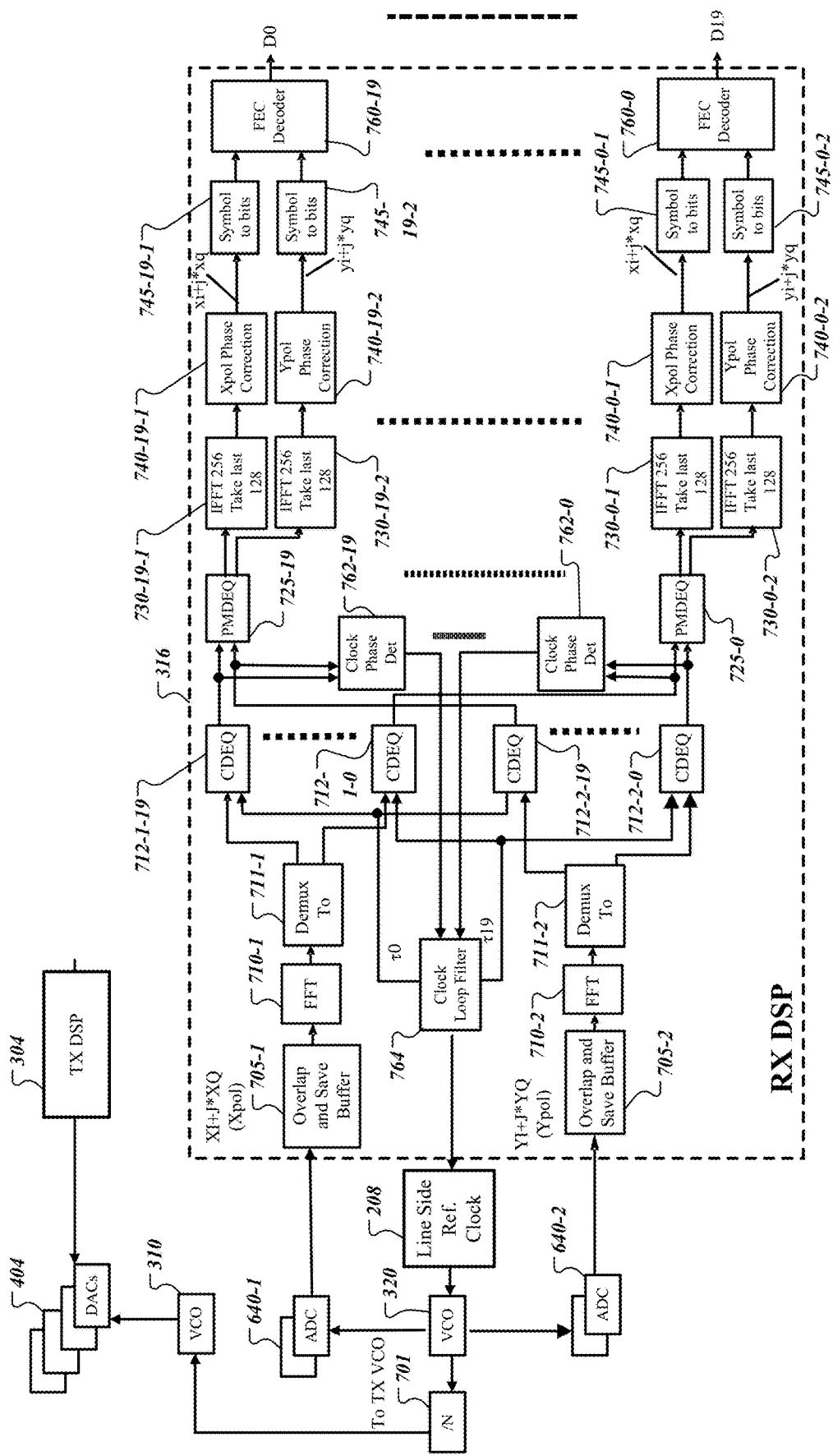
FIG. 7 is a block diagram that illustrates an example of a receive DSP.

FIG. 7 illustrates exemplary components of receiver DSP 316. FIG. 7 illustrates similar components to components shown in FIGS. 3, 4, 5, and 6. As noted above, ADCs 640-1 and 640-2 output digital samples corresponding to the analog inputs supplied to the ADCs 640-1 and 640-2. In one particular example, each ADC 640-1 and 640-2 may supply the samples at a rate of 64 GSamples/s. The digital samples correspond to symbols carried by the X polarization, the optical subcarriers, and may be represented by the complex number XI+j*XQ. The digital samples may be provided to overlap and save buffer 705-1 and overlap and save buffer 705-2, as shown in FIG. 7. FFT component or circuit 710-1 may receive the 2048 vector elements, for example, from the overlap and save buffer 705-1 and convert the vector elements to the frequency domain using, for example, a fast Fourier transform (FFT). The FFT component 710-1 may convert the 2048 vector elements to 2048 frequency components, each of which may be stored in a register or "bin" or other memory, as a result of carry out the FFT.

The frequency components may then then be de-multiplexed by the de-multiplexers, such as de-multiplexer 711-1 and 711-2, and groups of such components may be supplied to a respective one of chromatic dispersion equalizer (CDEQ) circuits 712-1-0 to 712-1-19, each of which may include a finite impulse response (FIR) filter that corrects, offsets or reduces the effects of, or errors associated with chromatic dispersion of the transmitted optical subcarriers. The CDEQ circuits will be described below. Each of CDEQ circuits 712-1-0 to 712-1-19 supplies an output to a corresponding polarization mode dispersion (PMD) equalizer circuit 725-0 to 725-19.

Digital samples output from ADC 640-2 associated with Y polarization components of subcarrier SC1 may be processed in a manner similar to that of digital samples output from ADC 640-1 and associated with the X polarization component of each subcarrier. Namely, overlap and save buffer 705-2, FFT 710-2, de-multiplexer 711-2, and CDEQ circuits 712-2-0 to 712-2-19 may have a similar structure and operate in a similar fashion as buffer 705-1, FFT component 710-1, de-multiplexer 711-1, and CDEQ circuits 712-1-0 to 712-1-19, respectively. For example, each of CDEQ circuits 712-2-0 to 712-19 may include a finite impulse response (FIR) filter that corrects, offsets, or reduces the effects of, or errors associated with chromatic dispersion of the transmitted optical subcarriers. In addition, each of CDEQ circuits 712-2-0 to 712-2-19 provides an output to a corresponding one of polarization mode dispersion equalizer (PMDEQ) 725-0 to 725-19.

As further shown in FIG. 7, the output of one of the CDEQ circuits, such as CDEQ 712-1-0, may be supplied to clock phase detector circuit 762-0 to determine a clock phase or clock timing associated with the received subcarriers. The output of one of the CDEQ circuits can include X-Polarity and Y-polarity data for one subcarrier, for example. Additionally, the CDEQ 712-1-19 may supply an output to clock phase detector circuit 762-19 to determine the clock phase or clock timing associated with the received subcarriers. The CDEQ 712-2-0 may supply its output to clock phase detector circuit 762-0. Lastly, the CDEQ 712-2-19 may supply its output to clock phase detector 762-19. Each of the clock phase detectors 762-0 through 762-19 may determine the clock phase or clock timing adjustments associated with the received subcarriers. The clock phase detectors 762-0 through 762-19 may supply a frequency domain representation of a clock phase or clock timing adjustments to the clock loop filter 764. Clock loop filter 764 is similar to clock recovery module 318. In particular, the clock phase detectors 762-0 through 762-19 indicate the timing or phase error associated with a particular subcarrier for X-polarity and Y-polarity. Thus, the clock loop filter 764 receives the timing or phase error associated with the X-polarity and Y-polarity data associated with the particular subcarrier.

The clock loop filter 764 provides the clock phase or clock timing adjustments to the line side reference clock 208, such as the line side reference clock 208 described with respect to FIGS. 2 and 3. The line side reference clock 208 generates adjustment or control of timing data to provide to the voltage controlled oscillator (VCO) 320 using the clock phase or timing adjustments from the clock loop filter 764. In particular, the adjustment or control of timing data indicates whether the VCO 320 should increase its sequence rate or decrease its sequence rate. The VCO 320 uses the receive clock phase or clock timing adjustment to generate a sequence that drives the sampling phase for each of the ADCs 640-1 and 6402. In operation, the VCO 320 then locks to the input data signal and then the sampling of the ADCs 640-1 and 6402 is sampling synchronous to the input data signal without error and achieving time synchronization.

Additionally, the clock loop filter 764 generates and provides a delay value of $\tau 0$-$\tau 19$ to each of the groups of CDEQ circuits 712-1-0 through 712-1-19 and CDEQ circuits 712-2-0 through 712-2-19.

The ADCs 640-1 and 640-2 sample each of the subcarriers from the input data signal. Consequentially, each of the samples' subcarriers has the same timing. In some cases, each subcarrier received from the input data signal may have a different timing error because each leaf device that receives the input data signal may have a slightly different sampling rate or tuned local oscillators that affects the subcarriers. The delay values of $\tau 0$-$\tau 19$ provided to the groups of CDEQ circuits fixes the potential different sampling rates applied to each of the subcarriers from the input data signal.

Additionally, the output of VCO 320 is provided to a divisor module 701 to divide down the rate into a lower integer. For example, the VCO 320 may provide a sequence output of 32 GHz. The divisor module 701 may divide the sequence output of 32 GHz by an integer, such as 8, to generate a 4 GHz signal. Thus, the 4 GHz signal is provided to the VCO 310 to be used by the transmit DSP 304 and the DACs 404. The VCO 310 locks to the signal provided by the VCO 320 and adjusts the sampling phase of the DACs 404. Thus, the DACs 404 can then sample the output signal provided by the TX DSP 304 at the same sampling rate used by the ADCs 640-1 and 640-2. Now, the DACs 404 transmit data at the same clocking frequency that is received by the ADCs 640-1 and 640-2. Then, in the corresponding leaf system, when the RX DSP 316 locks onto the received subcarrier, then the leaf system can transmit data at the same timing or clocking frequency that was received back to the intermediary system, and subsequently to the optical system 102. When the optical system 102 receives the data from the corresponding leaf system, the optical system 102 receives data at the same clocking frequency rate that it transmitted to the corresponding leaf system. Each leaf node performs this process so that the optical system 102 receives subcarriers from each of the leaf nodes at the same clocking frequency.

Each of PMDEQ circuits 725 may include another FIR filter that corrects, offsets, reduces the effects of, or errors associated with PMD of the transmitted optical subcarriers. Each of PMDEQ circuits 725 may supply a first output to a respective one of IFFT components or circuits 730-0-1 to 730-19-1 and a second output to a respective one of IFFT components or circuits 730-0-2 to 730-19-2. Each of the IFFT components or circuits may convert a 256-element vector, in this example, back to the time domain as 256 samples in accordance with, for example, an inverse fast Fourier transform (IFFT).

Time domain signals or data output from IFFT 730-0-1 to 730-19-1 are supplied to a corresponding one of Xpol carrier phase correction circuits 740-1-1 to 740-19-1, which may apply carrier recovery techniques to compensate for X polarization transmitter (e.g., laser 408) and receiver (e.g., local oscillator laser 610) linewidths. In some implementations, each carrier phase correction circuit 740-1-1 to 740-19-1 may compensate or correct for frequency and/or phase differences between the X polarization of the transmit signal and the X polarization of light from the local oscillator 610 based on an output of Xpol carrier recovery circuit 740-0-1, which performs carrier recovery in connection with one of the subcarrier based on the outputs of IFFT 730-01. After such X polarization carrier phase correction, the data associated with the X polarization component may be represented as symbols having the complex representation XI+J*XQ in a constellation, such as a QPSK constellation or a constellation associated with another modulation formation, such as an M-quadrature amplitude modulation (QAM), M being an integer. In some implementations, the taps of the FIR filter included in one or more of PMDEQ circuits 725 may be updated based on the output of at least one of carrier phase correction circuits 740-0-1 to 740-19-01.

In a similar manner, time domain signals or data output from IFFT 730-0-2 to 730-19-2 are supplied to a corresponding one of Ypol carrier phase correction circuits 740-0-2 to 740-19-2, which may compensate or correct for Y polarization transmitter (e.g., laser 408) and receiver (e.g., local oscillator laser 610) linewidths. In some implementations, each carrier phase correction circuit 740-0-2 to 740-19-2 may also corrector or compensate or correct for frequency and/or phase differences between the Y polarization of the transmit signal and the Y polarization of light from the local oscillator 610. After such Y polarization carrier phase correction, the data associated with the Y polarization component may be represented as symbols having the complex representation YI+J*YQ in a constellation, such as a QPSK constellation or a constellation associated with another modulation formation, such as an m-quadrature amplitude modulation (QAM), m being an integer. In some implementations, the output of one of circuits 740-0-2 to 740-19-2 may be used to update the taps of the FIR filter included in one or more of PMDEQ circuits 725 instead of or in addition to the output of at least one of the carrier recovery circuits 740-0-1 to 740-19-1.

Each of the symbols-to-bits circuits or components 745-0-1 to 745-19-1 may receive the symbols output from a corresponding one of circuits 740-0-1 to 740-19-1 and map the symbols back to bits. For example, each of the symbol-to-bits components 745-0-1 to 745-19-1 may map one X polarization symbol, in a QPSK or M-QAM constellation, to Z bits, where Z is an integer. For dual-polarization QPSK modulated subcarriers, Z is four. Bits output from each of component 745-0-1 to 745-19-1 are provided to a corresponding one of FEC decoder circuits 760-0 to 760-19.

Y polarization symbols are output form a respective one of circuits 740-0-2 to 740-19-2, each of which having the complex representation YI+J*YQ associated with data carried by the Y polarization component. Each Y polarization, like the X polarization symbols noted above, may be provided to symbols to a corresponding one of symbol-to-bits circuits or components 745-0-2 to 745-19-2, each of which having a similar structure and operating a similar manner as symbols-to-bits components or circuits 745-0-1 to 745-19-1. Each of circuits 745-0-2 to 745-19-2 may provide an output to a corresponding one of FEC decoder circuits 760-0 to 760-19.

Each of FEC decoder circuits 760 may remove errors in the outputs of symbol-to-bit circuits 745 using forward error correction. Such error corrected bits, which may include user data for output, may be supplied as a corresponding one of outputs D0 to D19.

While FIG. 7 shows RX DSP 316 as including a particular number and arrangement of functional components, in some implementations, RX DSP 316 may include additional functional components, fewer functional components, different functional components, or differently arranged functional components.

Figure 8:
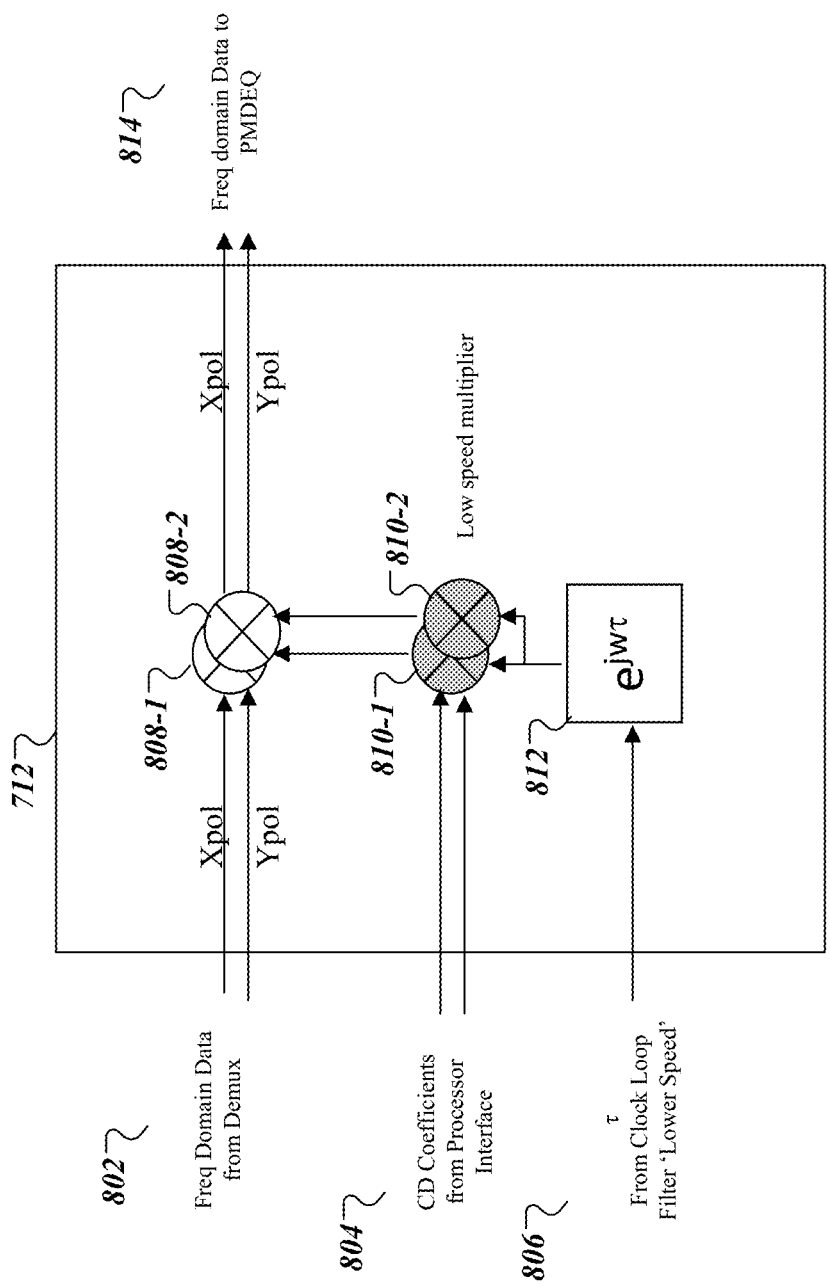
FIG. 8 is a block diagram that illustrates an example of a chromatic dispersion equalizer circuit (CDEQ).

FIG. 8 is a block diagram that illustrates an example of a chromatic dispersion equalizer circuit (CDEQ) 712. The CDEQ 712 is included in the RX DSP 316, as shown in FIG. 7 (seen as 712-1-0 to 712-1-19 and 712-2-0 to 712-2-19). The CDEQ 712 includes a complex conjugate module 812, two low speed multipliers 810-1 and 810-2, and two multipliers 808-1 and 808-2. Each low speed multipliers 810-1 and 810-2 and multipliers 808-1 and 808-2 process received X-polarity data and Y-polarity data, respectively. In some implementations, the CDEQ 712 may receive more or less than two inputs, and consequently, can include more or less than two multipliers as shown in FIG. 8.

The CDEQ 712 receives frequency domain data 802, e.g., subcarrier data, from the de-multiplexer blocks, e.g., de-multiplexer 711. In particular, the CDEQ 712 receives X-polarity data and Y-polarity data of the frequency domain data 802. The CDEQ 712 receives CD coefficient data 804 from the processor interface, such as a microprocessor. The CD coefficient data 804 can include a constant signal data. Additionally, the CDEQ 712 receives delay data 806 having value of $\tau$ from the clock loop filter 764 for adjusting the clock phase delay. The $\tau$ value corresponds to a delay, such as $\tau 0$-$\tau 19$ as illustrated in FIG. 7. Moreover, the $\tau$ value is a single value provided to correct the delay associated with both the X-polarity data and the Y-polarity data. For example, the clock loop filter 764 may provide the τ value at a 10 MHz rate. The τ value is typically provided at a speed much lower than the data rates of the frequency domain data 802, which typically is received by the CDEQ 712 on the order of 100 MHz or higher.

The complex conjugate module 812 receives the delay data 806 and converts the delay data 806 to complex conjugate data, which corresponds to a delay in the frequency domain. The complex conjugate module 812 outputs the complex conjugate data to each of the low speed multipliers 810-1 and 810-2. The low speed multipliers 810-1 and 810-2 receive the complex conjugate data and the CD coefficient data 804 and generate low speed complex conjugate data. In particular, low speed multiplier 810-1 multiplies the complex conjugate data by the X-polarity CD coefficient data to generate X-polarity low speed complex conjugate data. Additionally, the low speed multiplier 810-2 multiplies the complex conjugate data by the Y-polarity CD coefficient data to generate Y-polarity low speed complex conjugate data. The low speed multipliers 810-1 and 810-2 output the X-polarity and Y-polarity low speed complex conjugate data to the multipliers 808-1 and 808-2.

The multipliers 808-1 and 808-2 receive the output from the low speed multipliers 810-1 and 810-2 and use the received output to generate frequency domain data 814. In particular, the multiplier 808-1 multiplies the X-polarity data from the frequency domain data 802 with the X-polarity low speed complex conjugate data. Additionally, the multiplier 808-2 multiplies the Y-polarity data from the frequency domain data 802 with the Y-polarity low speed complex conjugate data. The multipliers 808-1 and 808-2 outputs X-polarity frequency domain data 814 and Y-polarity frequency domain data 814 to the polarization mode dispersion equalizer (PMDEQ). Both the X-polarity and the Y-polarity output frequency domain data 814 have been adjusted by the CD coefficient data 804 and delayed by the delay data 806.

Figure 9:
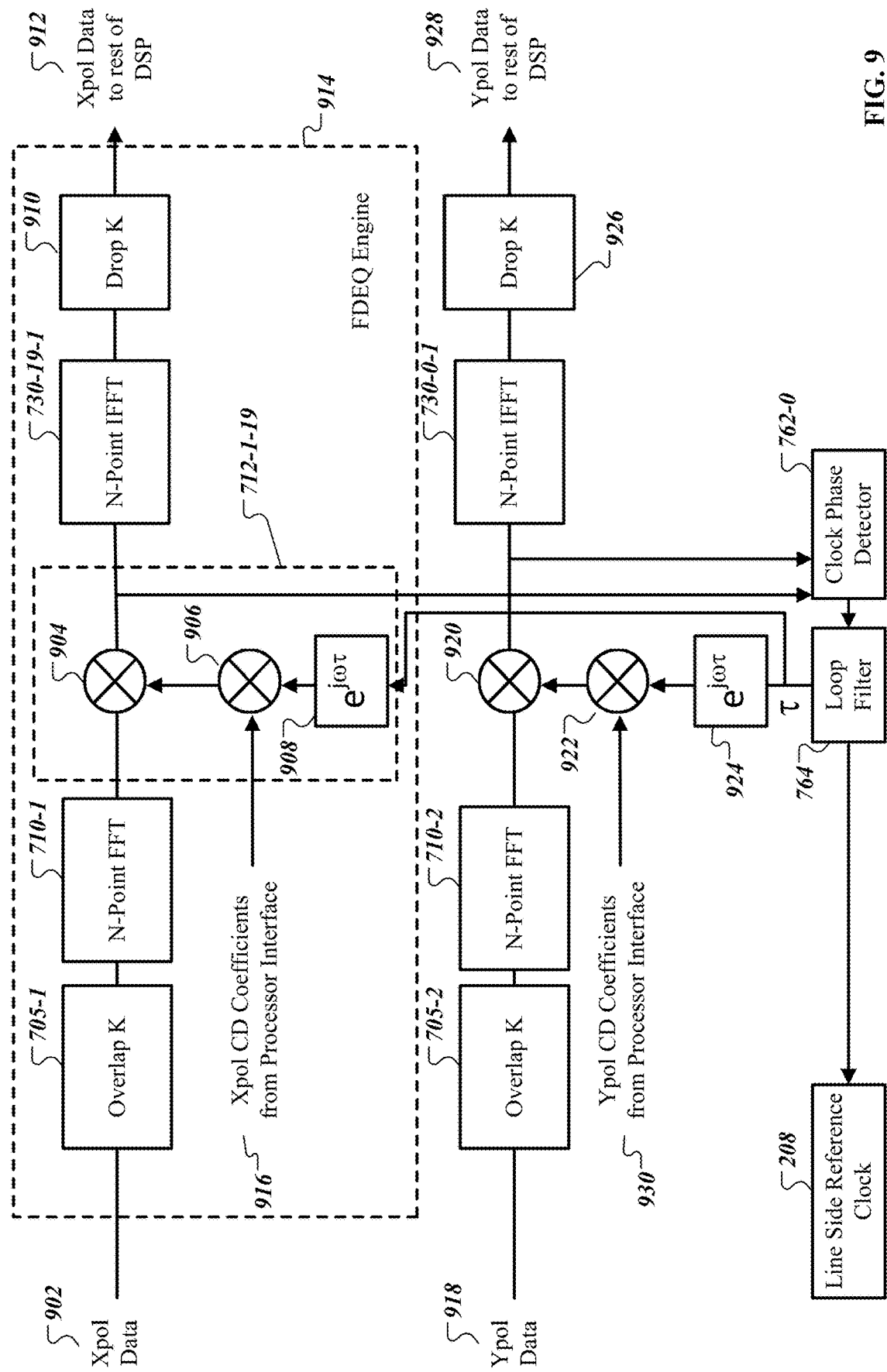
FIG. 9 is a block diagram that illustrates an example of a system illustrating internal components within the receive DSP.

FIG. 9 is a block diagram that illustrates an example of a system illustrating internal components within the receive DSP. FIG. 9 includes similar components to RX DSP 316 and coherent DSP 206 in FIG. 3, components in FIG. 6, components in FIG. 7, and components in FIG. 8. For example, FIG. 9 includes an overlap save K buffers 705-1 and 705-2 (collectively "overlap save buffers"), N-point FFT modules 710-1 and 710-2 (collectively "N-point FFT modules"), multipliers 904, 906, 920, and 922 (collectively "multipliers"), N-point IFFT modules 730-19-1 and 730-0-2 (collectively "N-point IFFT modules"), and drop K modules 910 and 926 (collectively "drop K modules"). Additionally, FIG. 9 includes a loop filter 764, a clock phase detector, such as clock phase detector 762-0, and complex conjugate modules 908 and 924 (collectively "complex conjugate modules").

In some implementations, the overlap save buffers receive complex symbols from the ADCs. In particular, overlap save buffer 705-1 receives Xpol complex symbols, e.g., XI+J*XQ symbols, from the ADCs 640-1. Overlap save buffer 705-2 receives Ypol complex symbols, e.g., YI+J*YQ symbols, from the ADCs 640-2. The overlap and save buffers may receive 64 symbols, e.g., 128 samples with zero insertion in between symbols, at a time from the ADCs 640-1 and 640-2. The overlap and save buffers may combine 64 new symbols, e.g., 128 samples if the number of bits per symbol is 2, with the previous 64 symbols, e.g., 128 samples from the ADCs in a two clock cycle worth of buffered data. Alternatively, this functionality with the overlap and save buffers can grab a different number of symbols, a different number of samples, and a different size buffered into the overlap and save buffers.

The N-point FFT modules may receive 128 symbols from the overlap and save buffers every clock cycle. In addition, the N-Point FFT modules converts the received 128 symbols to the frequency domain using, for example, a fast Fourier transform (FFT). The N-point FFT may form 128 frequency bins as a result of performing the FFT. In the next clock cycle, when the N-Point FFT modules receives the 128 symbols stored in the overlap and save buffers, the overlap and save buffers will shift out the $1^{st}$ 64 symbols so that the overlap and save buffer contains the $2^{nd}$ 64 symbols and the $3^{rd}$ 64 symbols. Then, the N-Point FFT modules will take the FFT of the previous 64 symbols, e.g., $2^{nd}$ 64 symbols plus the next 64 symbols, e.g., $3^{rd}$ 64 symbols, received from the overlap and save buffers. Thus, each overlap and save buffer performs an overlap function. The 128 frequency bins are then passed to a frequency domain equalizer (FDEQ) where the 128 frequency bins are pulse shaped.

FIG. 9 illustrates an FDEQ engine 914 that includes an overlap save buffer 705-1, N-point FFT 710-1, a multiplier 904, a multiplier 906, a complex conjugate module 908, Xpol chromatic dispersion (CD) coefficients 916, N-point IFFT 730-19-1, and drop K buffer 910. Each FDEQ engine 914 includes a CDEQ, such as CDEQ 712-1-19. Additionally, FIG. 9 illustrates another FDEQ engine that comprises an overlap save buffer 705-2, N-point FFT 710-2, a multiplier 920, a multiplier 922, a complex conjugate module 924, Ypol CD coefficients from processor interface 930, an N-point IFFT 730-0-1, and a drop k buffer 926.

The FDEQ engine may apply a pulse-shaping filter to the 128 frequency bins. The purpose of the FDEQ engine 914 is to shape the signal to the desired spectrum so that channels can be packed together on a super-channel while minimizing inter-symbol interference (ISI). The FDEQ engine may be used to compensate for chromatic dispersion introduced or induced by the transmission, such as correction amplitude adjustments produced by the transmission. In particular, the FDEQ engine 914, for example, is configured or designed to have a bit more ISI in order to accommodate dispersion effects and a pre-determined amount of delay, τ. The multiplier 906 multiplies the Xpol CD coefficients 916 by the complex conjugate factors. For example, the Cpol CD coefficients 916 may include 128 coefficients generated by the processor interface on the leaf system. The output of the multiplier 906 is provided to multiplier 904, where the values are multiplied by the 128 frequency bins from the N-point FFT 710-1. The output of the multiplier 904 forms a 256-element vector. A similar process occurs for the FDEQ engine for the corresponding Ypol data 918.

After frequency dispersion, the output of the multiplier 904 and output of multiplier 920 are fed to a clock phase detector 762-0. The clock phase detector 762-0 determines the phase error of the Xpol symbols and the phase error of the Ypol symbols. The phase error, generated by the clock phase detector 762-0, is then sent to the loop filter 764. The loop filter 764 generates a delay of τ that corresponds to the phase error. The delay of τ can be positive, e.g., advance the delay, or negative, e.g. reduce the delay, depending upon the direction of the phase error. Then, to adjust the delay of the Xpol and Ypol signals, the complex conjugate modules 908 and 924 generate complex conjugate values using the delay of τ, having the form of $e^{jwτ}$. This process of generating and applying the delay of τ creates a phase feedback loop that cleans out the fast jitter and chromatic dispersion within the Xpol data 902 and the Ypol data 918. The phase feedback loop is used for fast controlling the jitter components on the Xpol and Ypol data.

In some implementations, the loop filter 764 also outputs a tuning port to the line side reference clock 208. The tuning port is used to slowly tune the line side reference clock so as to long-term center the reference clock to the input subcarrier. The frequency difference between the reference clock and the input signal carrier frequency is long-term zeroed by this phase feedback loop shown in FIG. 9. Long-term zeroed corresponds to how fast the clock phase error converges to zero within a particular time window.

The N-point IFFT 730-19-1 may receive the 256-element vector and return the signal back to the time domain. The N-point IFFT 730-19-1 may convert the signal to the time domain using, for example, an inverse fast Fourier transform (IFFT). The time domain signal is provided to the drop K modules.

The drop K modules take the first 128 samples in the time domain from the 256-time domain element vector and output the first 128 samples to the rest of the DSP. For example, the drop K module 910 outputs Xpol data 912, including 128 samples, to the rest of the RX DSP 316. Additionally, the drop K module 926 output Ypol data 928, including 128 samples, to the rest of the RX DSP 316.

Figure 10:
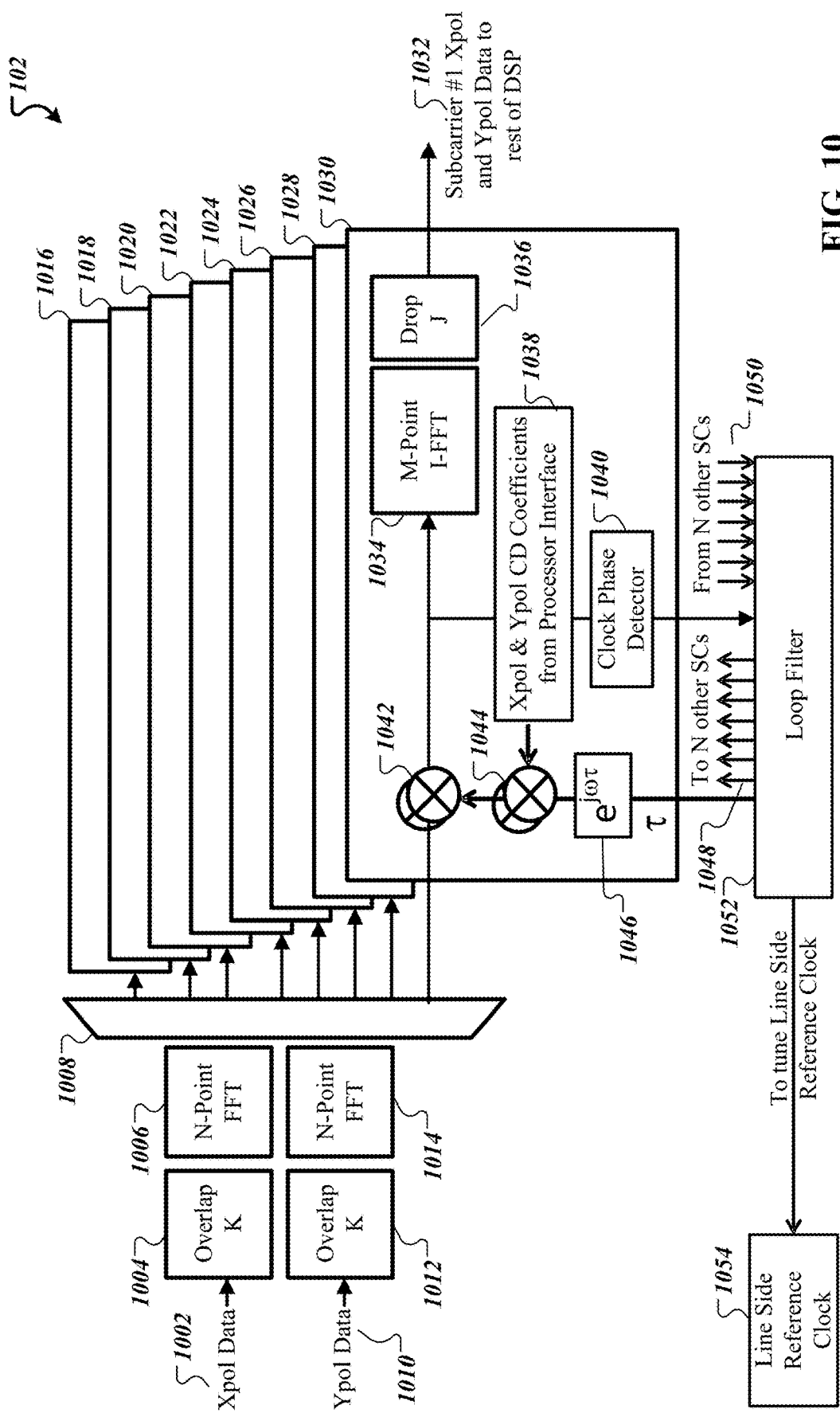
FIG. 10 is a block diagram that illustrates an example of optical system.

FIG. 10 is a block diagram that illustrates an example of optical system 102. For example, FIG. 10 illustrates various components within some implementations of the optical system 102, as illustrated in systems 100 and 101. The optical system 102 includes components similar to those shown in FIGS. 2 to 9. However, the optical system 102 includes multiple instances of an FDEQ engine, as discussed below.

In some implementations, the optical system 102 illustrates eight FDEQ engines. For example, FDEQs 1016, 1018, 1020, 1022, 1024, 1026, 1028 and 1030. The number of FDEQ engines in the optical system 102 can be directly proportional to the number subcarriers transmitted to the leaf systems. For example, the optical system 102 includes eight FDEQ engines and the optical system 102 transmits eight subcarriers in a super channel. In other implementations, the optical system 102 can include sixteen FDEQ engines. Sixteen FDEQ engines can correspond to the optical system 102 transmitting sixteen subcarriers in a super channel. In other implementations, the optical system 102 can include another number of FDEQ engines.

Each FDEQ engine, such as FDEQ engine 1030, includes similar components to the FDEQ engine shown in systems 700 and 900. For example, the FDEQ engine 1030 include multipliers 1042, multipliers 1044, a complex conjugate module 1046, a clock phase detector 1040, Xpol and Ypol CD coefficients from processor interface at the optical system 102, an M-point IFFT 1034, and a drop J module 1036. The components within the FDEQ engine 1030 perform similar functions to the components within the FDEQ engines described in FIG. 7 and FIG. 9, and thus will not be described here.

In some implementations, the optical system 102 receives Xpol symbols 1002 and Ypol symbols 1010. The Xpol symbols 1002 and Ypol symbols 1010 correspond to symbols of subcarriers from each of the leaf systems, digital multiplexed and transmitted by the intermediary system 106. The overlap K buffers 1004 and 1012 receive the Xpol data 1002 and the Ypol data 1010, respectively, and perform similar functions to the overlap K buffers shown in FIGS. 7 and 9. The output of the overlap K buffers are provided to the N-point FFT modules 1006 and 1014. The N-point FFT modules 1006 and 1014 convert the time domain signals into frequency domain signals by performing a fast Fourier transform. The output of N-point FFT modules 1006 and 1014 are provided to a de-multiplexer 1008. For example, the N-point FFT modules may take a 1024 point FFT.

The de-multiplexer 1008 may include an AWG or some other de-multiplexer device. The de-multiplexer 1008 may supply multiple optical signals, e.g., multiple subcarrier signals, based on the received FFT signal. The de-multiplexer 1008 may supply an optical signal, e.g., each subcarrier, to each FDEQ engine.

For each subcarrier input to an FDEQ engine, the FDEQ engine performs both CD compensation and delay compensation, as described with respect to FIGS. 7 and 9. As illustrated in optical system 102, there are eight FDEQ engines. Each FDEQ engine includes a clock phase detector that can detect phase error associated with each received subcarrier. Each FDEQ engine provides the detected phase error associated with the received subcarrier to the loop filter 1052.

The loop filter 1052 that extracts the high frequency jitter information 1050 from each received subcarrier from each FDEQ engine. The loop filter 1052 also feeds the detected jitter information 1048 independently to each complex conjugate module 1046 for delay and jitter compensation for each subcarrier using the determined τ for $e^{j w \tau}$. Accordingly, each subcarrier may accumulate its own jitter independent from other subcarriers. This is because each subcarrier can travel a different optical fiber path from the leaf system to the intermediary and from the intermediary system to the optical system. Consequently, each subcarrier will accumulate different jitter and different dispersion along its own respective transmission path. Thus, the loop filter and complex conjugate module for each FDEQ engine can offset, correct, or reduce the jitter and dispersion effects associated with each subcarrier in a respective FDEQ engine. In some implementations, the mean clock frequency between each subcarrier may be similar due to the active tuning of the reference clock obtained in each leaf system.

In some implementations, the optical system may be designated as "master" to each of the leaf systems. Likewise, each of the leaf systems may be designated as "slaves" to the optical system. The optical system is designated as a "master" because it does not tune its line side reference clock 1054 to the data rates of the subcarriers transmitted by the leaf systems. Rather, the line side reference clock of each of the leaf systems are tuned to the line side reference clock 1054 of the optical system. Because the line side reference clocks of each of the leaf systems are tuned to the line side reference clock of the optical system, the optical system is designated as a "master," and the leaf systems are designated as "slaves" to the optical system. Otherwise, if the line side reference clock 1054 was tuned to the data rate of the subcarriers transmitted by the leaf system, a "running away" would occur as both systems' reference clock would be tuned at the same time. The "running away" effect would ensure that the line side reference clocks of the leaf systems would not synchronize to the line side reference clock of the optical system, and vice versa.

Figure 11:
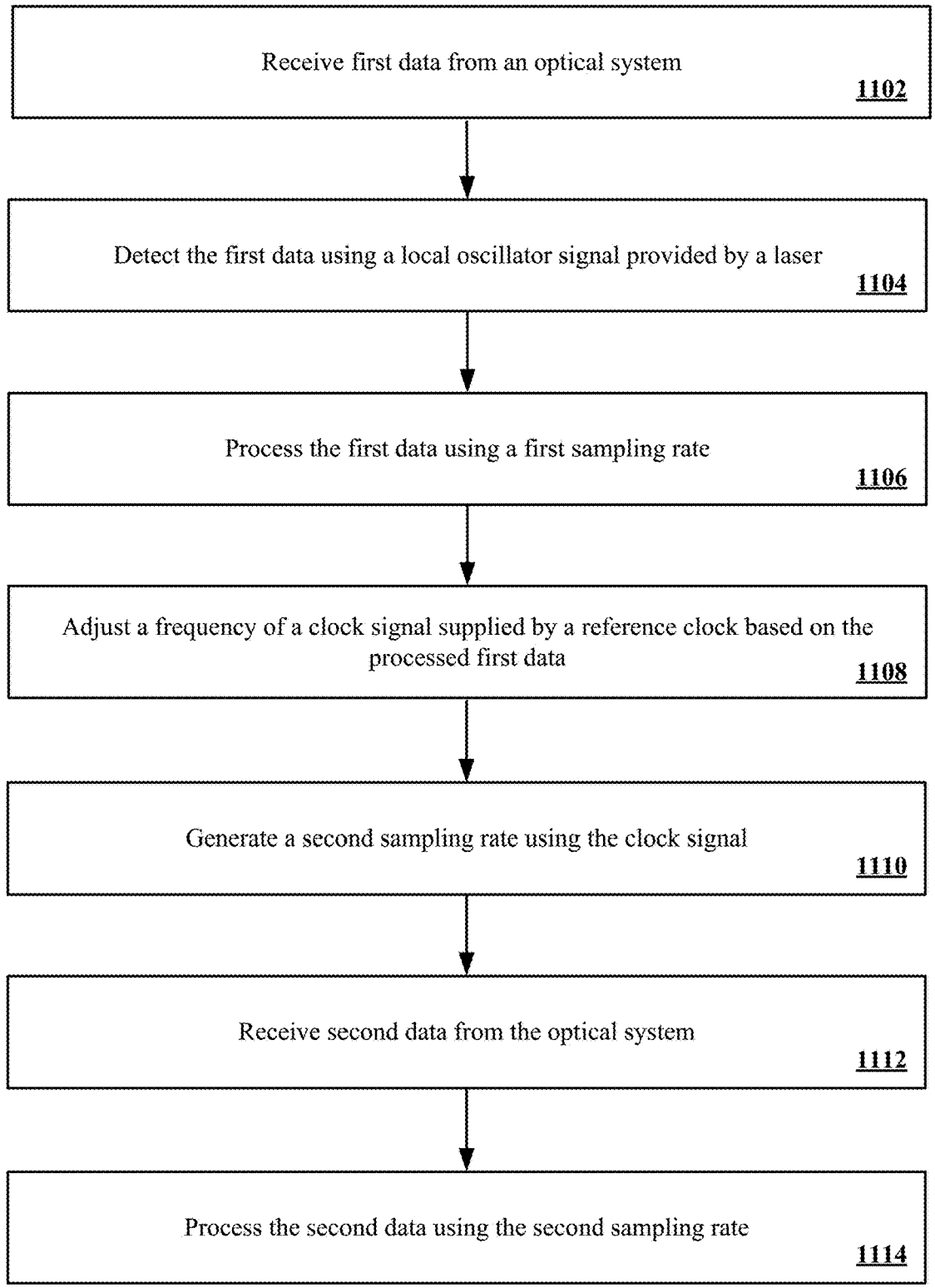
FIG. 11 is a flow diagram that illustrates an example of a process for down-stream broadcasting data from an optical system to multiple leaf systems.

FIG. 11 is a flow diagram that illustrates an example of a process 1100 for down-stream broadcasting data from an optical system to multiple leaf systems. The process 1100 can be performed, for example, by a coherent digital signal processor (DSP) within a leaf system or within the intermediary system.

The coherent DSP receives first data from an optical system (1102). The first data includes a plurality of subcarriers transmitted from the optical system at a first data rate. For example, the first data rate can include 100 GHz. Each subcarrier is transmitted at a second data rate, where the second data rate can include 10 GHz. The first data can include ten subcarriers, each transmitted at 10 GHz, to give a total data rate of 100 GHz. The coherent DSP processes the first data.

The coherent DSP detects the first data using a local oscillator signal provided by a laser (1104). For example, the coherent DSP uses the local oscillator signal provided by the laser to detect a particular subcarrier from the plurality of subcarriers. The particular subcarrier may be located at a particular frequency and the local oscillator signal enables the coherent DSP to detect that particular subcarrier.

The coherent DSP processes the first data using a first sampling rate (1106). A line side reference clock associated with the coherent DSP instructs its ADCs to sample the particular subcarrier at a first sampling rate, such as 16 GHz. In particular, the line side reference clock instructs a VCO to increase or decrease the ADC's sampling rate. The ADCs samples the particular subcarrier at 16 GHz and outputs the sampled subcarrier in the digital domain to the receive DSP within the coherent DSP.

The coherent DSP adjusts a frequency of a clock signal supplied by a reference clock based on the processed first data (1108). In particular, the receive DSP detects a clock phase error or timing error associated with the sampled subcarrier. The error can be based on the sampling rate of the ADCs. The receive DSP provides the clock phase error or timing error to the line side reference clock to adjust the frequency of it clock signal supplied to the VCO.

The coherent DSP generates a second sampling rate using the clock signal (1110). The line side reference clock instructs its VCO to increase or decrease the sampling rate of the ADCs based on the clock phase error or timing error received from the receive DSP. For example, the line side reference clock instructs its VCO to increase the sampling rate of the ADCs to 16.01 GHz. The VCO provides a clock signal to the ADCs that changes its sampling rate from 16 GHz to 16.01 GHz. Additionally, the line side reference clock instructs another VCO to increase the sampling rate of a DAC to 16.01 GHz. In this case, when the transmit DSP in the coherent DSP transmits data out of the DAC, the transmitted data will be sampled at 16.01 GHz, which is the same sampling rate used by the ADC.

The coherent DSP receives second data from the optical system (1112). This is similar to 1102 and 1104. The second data includes a plurality of subcarriers and a detected subcarrier from the plurality of subcarriers.

The coherent DSP processes the second data using the second sampling rate (1114). The ADCs now sample the subcarrier from the plurality of subcarriers at 16.01 GHz, for example. The ADCs provide the sampled subcarrier to the receive DSP. The receive DSP does not detect a clock phase error or timing error associated with the sampled subcarrier.

Additionally, the coherent DSP transmits data to the optical system at a rate based on the clock signal. For example, the coherent DSP's DAC transmits data to the optical system at the second sampling rate, which is the same rate at which the ADC samples data to provide to the receive DSP.

Various aspects of the disclosure and the functional operations described in this specification may be implemented in digital electronic circuitry, or in computer software, firmware, or hardware, including the structures disclosed in this specification and their structural equivalents, or in combinations of one or more of them. Likewise, various aspects of the disclosure may be implemented as one or more computer program products, i.e., one or more modules of computer program instructions encoded on a computer-readable medium for execution by, or to control the operation of, data processing apparatus. The computer readable medium may be a non-transitory computer readable storage medium, a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

In some instances, various processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer may be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non-volatile memory, media, and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory may be supplemented by, or incorporated in, special purpose logic circuitry.

Although a few implementations have been described in detail above, other modifications are possible. For example, the logic flows depicted in the figures do not necessarily require the particular order shown, or sequential order, to achieve desirable results. In addition, other actions may be provided, or actions may be eliminated, from the described flows, and other components may be added to, or removed from, the described systems.

Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

In some cases, various features described in connection with different embodiments may be combined in the same implementation. Further, as the foregoing implementations are intended as examples, various features may be omitted in some cases, and/or additional features may be present in some cases.

Thus, although particular examples of the subject matter have been described, other implementations are within the scope of the claims.

What is claimed is:

1. An apparatus comprising:
a receiver comprising:
a local oscillator laser providing a local oscillator signal,
a detector circuit operable to receive a first optical signal and detect first data carried by the first optical signal based on the local oscillator signal,
a reference clock circuit supplying a clock signal,
a digital signal processor (DSP) operable to receive the first data and supply a control signal to the reference clock circuit based on the first data, the reference clock circuit being operable to adjust the clock signal based on the control signal; and
a transmitter operable to output a second optical signal carrying second data, the second data having a second data rate that is based on the clock signal.

2. The apparatus of claim 1, wherein the first data is carried by a plurality of subcarriers at a first data rate, and each subcarrier carries a respective portion of the first data at the second data rate, wherein the second data rate is different from the first data rate.

3. The apparatus of claim 2, wherein:
the clock signal comprises a frequency that matches the second data rate.

4. The apparatus of claim 1, wherein the apparatus is provided in a leaf node and the first optical signal is transmitted from a hub node, the first data having a first data rate and the second data having the second data rate, the second data rate being synchronized to the first data rate.

5. The apparatus of claim 1, wherein the clock signal is a first clock signal, the apparatus further comprising:
a photodiode circuit that supplies an electrical signal based on the first optical signal;
an analog-to-digital converter (ADC); and
a voltage controlled oscillator (VCO) operable to receive the first clock signal from the reference clock circuit and provide a second clock signal to the ADC,
the ADC operable to generate a digital signal based on the electrical signal and the second clock signal, the digital signal being provided to the DSP.

6. An apparatus comprising:
a receiver comprising:
a local oscillator laser providing a local oscillator signal,
a detector circuit operable to receive a first optical signal and detect a first portion of a first data stream carried by the first optical signal based on the local oscillator signal,
a reference clock circuit supplying a clock signal,
a first digital signal processor (DSP) operable to receive the first portion of the first data stream and supply a control signal to the reference clock circuit based on the first portion of the first data stream, the reference clock circuit being operable to adjust the clock signal based on the control signal; and
a transmitter comprising:
a second DSP; and
a modulator supplying a second optical signal based on an output of the second DSP, such that the clock signal is supplied to the first and second DSPs, wherein the first DSP processes a second portion of the first data stream based on the clock signal and the second DSP supplies the output based on the clock signal.

7. The apparatus of claim 6, wherein:
the first DSP is operable to determine whether a clock phase error associated with the detected first portion of the first data stream is below a predetermined threshold; and
in response to the first DSP determining the clock phase error associated with the detected first portion of the first data stream is below the predetermined threshold, the apparatus is operable to transmit third data to an optical system based on the clock signal.

8. The apparatus of claim 7, wherein the first portion of the first data stream is carried by a plurality of subcarriers at a first data rate, and each subcarrier carries a respective portion of the first portion at a second data rate, wherein the second data rate is different from the first data rate.

9. The apparatus of claim 8, wherein:
the reference clock circuit is operable to supply the clock signal to the first DSP and the second DSP at a frequency that matches the second data rate to synchronize the clock signal of a leaf system to the second data rate of the optical system.

10. The apparatus of claim 8, wherein:
at least one analog-to-digital converter (ADC);
a voltage controlled oscillator (VCO) being operable to receive the clock signal from the reference clock circuit and provide a second clock signal to the at least one ADC;
the at least one ADC being operable to receive an analog signal from the optical system, convert the analog signal to a digital signal based on the second clock signal provided by the VCO, and provide the digital signal to the first DSP; and
the first DSP being operable to receive the digital signal from the at least one ADC, process the digital signal, generate the control signal based on the processed digital signal, and supply the control signal to the reference clock circuit.

11. The apparatus of claim 8, wherein:
at least one digital-to-analog converter (DAC);
a voltage controlled oscillator (VCO) being operable to receive the clock signal from the reference clock circuit and provide a second clock signal to the at least one DAC;
the at least one DAC being operable to receive a digital signal from the second DSP, convert the digital signal to an analog signal based on the second clock signal provided by the VCO, and provide the analog signal to the optical system; and
the second DSP being operable to provide the digital signal to the at least one DAC and receive the second clock signal provided by the VCO.

12. A system, comprising:
an optical system operable to transmit optical signals at a first data rate;
one or more leaf systems;
an intermediary system;
the intermediary system operable to receive the optical signals and broadcast the optical signals to each of the one or more leaf systems; and
wherein each of the one or more leaf systems comprises:
a receiver comprising:
a local oscillator laser providing a local oscillator signal,
a detector circuit operable to receive a first optical signal and detect first data carried by the first optical signal based on the local oscillator signal,
a reference clock circuit supplying a clock signal,
a digital signal processor (DSP) operable to receive the first data and supply a control signal to the reference clock circuit based on the first data, the reference clock circuit being operable to adjust the clock signal based on the control signal; and
a transmitter operable to output a second optical signal carrying second data, the second data having a second data rate that is based on the clock signal.

13. The system of claim 12, further comprising:
a photodiode circuit that supplies an electrical signal based on the first optical signal;
an analog-to-digital converter (ADC);
a first voltage controlled oscillator (VCO) operable to receive the clock signal from the reference clock circuit and to provide a second clock signal to the ADC;
the ADC operable to receive an analog signal from the optical system, generate a digital signal based on the analog signal using the second clock signal provided by the first VCO, and provide the digital signal to the DSP; and
the DSP is operable to receive the digital signal from the ADC, process the digital signal, generate the control signal based on the processed digital signal, and supply the control signal to the reference clock circuit.

14. The system of claim 13, further comprising:
a digital-to-analog converter (DAC);
a second DSP;
a second voltage controlled oscillator (VCO) being operable to receive the clock signal from the reference clock circuit and provide a third clock signal to the DAC;
the DAC operable to receive a second digital signal from the second DSP, convert the second digital signal to a second analog signal based on the third clock signal provided by the second VCO, and provide the analog signal to the optical system; and
the second DSP being operable to provide the digital signal to the DAC and receive the third clock signal provided by the second VCO.

15. The system of claim 14, wherein the third clock signal provided by the second VCO matches the second clock signal provided by the first VCO.

16. The system of claim 15, wherein the third clock signal and the second clock signal instruct the DAC and the ADC to sample at the same frequency.

17. The system of claim 12, wherein each of the one or more leaf systems comprises:
a client processing module operable to adjust a frequency of the clock signal to a second clock frequency to provide client data at the second clock frequency to other devices within the one or more leaf systems that process the client data at the second clock frequency.

18. The system of claim 17, further comprising a serializer/deserializer (SERDES), wherein:
the client processing module is operable to transmit the client data at the second clock frequency to the SERDES and adjust a frequency of a client side clock signal associated with a client side reference clock; and
the SERDES is operable to transmit the client data at the second clock frequency to the other devices and to receive the client side clock signal from the client side reference clock.

19. The system of claim 14, wherein:
the intermediary system is operable to receive the analog signal from each of the one or more leaf systems, multiplex the received analog signal from each of the one or more leaf systems, and provide the multiplexed analog signal to the optical system.

20. The system of claim 12, wherein:
the clock signal comprises a frequency that matches the second data rate.

* * * * *